(12) United States Patent
Hotta et al.

(10) Patent No.: US 9,359,676 B2
(45) Date of Patent: Jun. 7, 2016

(54) SURFACE TREATING APPARATUS

(71) Applicant: C. Uyemura & Co., Ltd., Osaka (JP)

(72) Inventors: Teruyuki Hotta, Osaka (JP); Hisamitsu Yamamoto, Osaka (JP); Takahiro Ishizaki, Osaka (JP); Masayuki Utsumi, Osaka (JP); Takuya Okamachi, Osaka (JP); Syunsaku Hoshi, Osaka (JP); Fujio Asa, Osaka (JP); Junji Mizumoto, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 56 days.

(21) Appl. No.: 14/038,340

(22) Filed: Sep. 26, 2013

(65) Prior Publication Data

US 2014/0116334 A1    May 1, 2014

(30) Foreign Application Priority Data

Oct. 31, 2012  (JP) .................................. 2012-239795

(51) Int. Cl.

| B05B 7/06 | (2006.01) |
|---|---|
| B05B 15/12 | (2006.01) |
| B05C 13/00 | (2006.01) |
| C23C 18/16 | (2006.01) |
| H05K 3/00 | (2006.01) |
| H05K 3/18 | (2006.01) |

(52) U.S. Cl.
CPC ......... *C23C 18/1619* (2013.01); *C23C 18/1628* (2013.01); *H05K 3/0085* (2013.01); *H05K 3/181* (2013.01); *H05K 2203/1518* (2013.01)

(58) Field of Classification Search
USPC .............. 118/326, 50, 634, 309, DIG. 7, 316, 118/500; 454/50; 55/DIG. 46; 134/72, 199
See application file for complete search history.

(56) References Cited

U.S. PATENT DOCUMENTS

| 2,168,821 | A | * | 8/1939 | Elliott ................. A01M 7/0042 239/127 |
| 4,371,422 | A | * | 2/1983 | Eidschun ............... H05K 3/068 216/13 |
| 4,620,894 | A | * | 11/1986 | Gurian ................. H05K 3/0085 156/345.21 |
| 4,957,129 | A | * | 9/1990 | Kraft et al. .................... 134/151 |
| 5,169,673 | A | * | 12/1992 | Demeny et al. ............... 427/477 |

FOREIGN PATENT DOCUMENTS

| JP | 09-031696 | 2/1997 |
| JP | 2006-118019 | 5/2006 |
| JP | 2011-032538 | 2/2011 |

* cited by examiner

*Primary Examiner* — Yewebdar Tadesse
(74) *Attorney, Agent, or Firm* — Jason H. Vick; Sheridan Ross, PC

(57) ABSTRACT

An tank such as an electroless copper plating tank 200, includes a liquid squirting part 4 having a squirt port 6 for squirting the processing solution Q from the squirt port 6 toward the treatment object obliquely upward to a horizontal plane, and hitting the processing solution Q on the upper area of the plate-like work 10 so that the processing solution Q runs down the plate-like work 10.

12 Claims, 22 Drawing Sheets

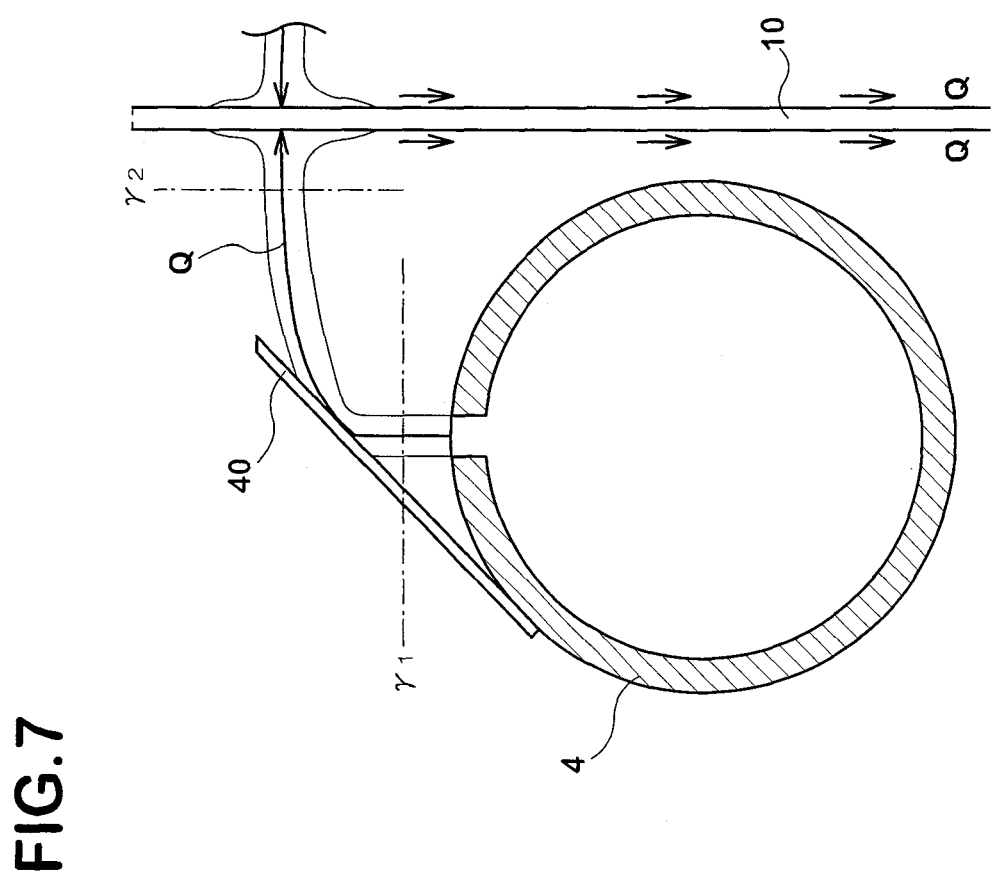

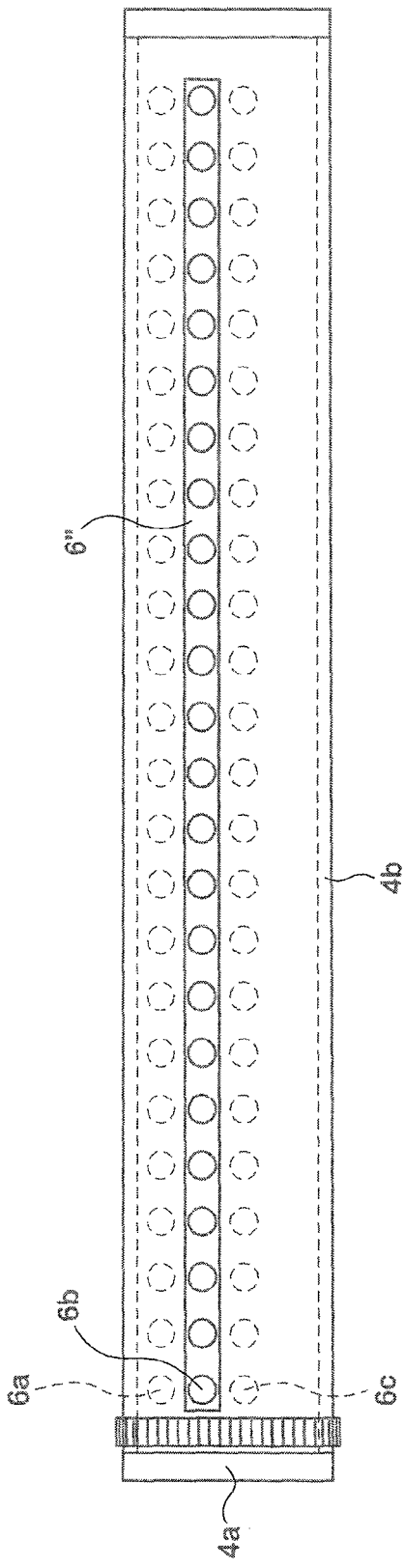
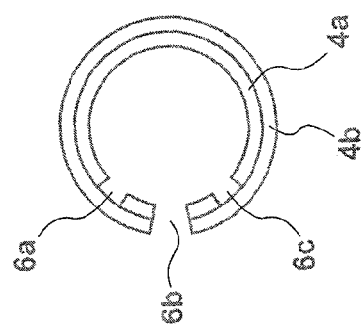
FIG.14A
FIG.14B

SURFACE TREATING APPARATUS

CROSS REFERENCE TO RELATED APPLICATIONS

This application claims the benefit under 35 U.S.C. 119(a) to Japanese Patent Application No. JP 2012-239795, filed Oct. 31, 2012, the entire disclosure of which is incorporated herein by reference in its entirety.

FIELD OF THE INVENTION

The present invention relates to a technique for surface treatment such as electroless plating; desmear process, pre-treatment or post-treatment onto a treatment object such as a printed circuit board.

BACKGROUND ART

Conventionally, as shown in FIG. 19, an electroless plating process was carried out by dipping a plural of plate-like works 10 housed in a rack R into processing solution Q accumulated in a tank (JP-A-2011032538). Here, unlike electroplating that an energization is carried out, electroless plating is a plating method that enable to plate merely by dipping a treatment object into the plating solution. By means of electroless plating, it is also possible to plate anon-conductor (insulators such as plastic, ceramics, etc.) as well.

A problem of dissolved oxygen in electroless plating or desmear process will be described. The existence of dissolved oxygen in the electroless copper plating solution causes a problem, because it leads to low precipitation of plating by the effect of restraining reaction between the electroless copper plating solution and a catalyst attaching to the work. Also, the existence of dissolved oxygen included in etching liquid used for desmear process causes a problem, because it leads to excessive etching on wetted part by the effect of promoting reaction of etching liquid to the work. For that reason, it is desirable to reduce an amount of the dissolved oxygen contained in the processing solution.

As shown in FIG. 20, there is the other plating apparatus, such as an electrolytic plating apparatus (JP-A-2006118019) which is attracting the plate-like work 10 into the processing solution Q smoothly by pouring the processing solution Q downwardly through a tapered aperture from above the tank V when the plate-like work 10 is falling into the tank V that comprises side walls W1, W2 proximally-positioned to the plate-like work 10. Also, there is the other plating apparatus, such as an electrolytic plating apparatus (JP-A-1997 (Hei09) 031696) which is squirting the processing solution in a vertically upward toward the work that is held horizontally.

DESCRIPTION OF PROBLEMS TO BE SOLVED BY THE INVENTION (i) However, the technique shown in FIG. 19 of JP-A-2011032538 requires the rise-and-fall mechanism for dipping the rack. This results in causing a problem that facility for electroless plating gets more complex and more larger. Also, this results in causing a problem that a mass of processing solution is required, because it is needed to dip into the electroless plating processing solution Q accumulated in a tank.

(ii) If the technique of JP-A-2006118019 is adopted for electroless plating, the processing solution Q may be running down the side walls W1, W2 inside of tank V. This results in causing a problem that desired quality of plating is not achieved. Also, this results in causing a problem that a mass of processing solution is required.

Also, the technique of JP-A-2006118019 shown in FIG. 20, the velocity of flowing processing solution increases until it is attached to the work because of gravity effect, as the processing solution is squirted from Liquid squirting headers 53L, 53R (FIG. 1 of JP-A-2006118019) downward to a horizontal plane. Further, an incidence angle to the plate-like work 10 becomes larger. Therefore, bubbles and rolling air into the processing solution are generated when the processing solution hit the work. This results in increasing of the amount of the dissolved oxygen in the processing solution and deterioration in quality of surface treatment. Further, the work might be bended or be collided with surrounding objects (iii) The technique of JP-A-1997 (Hei09) 031696 is for plating only one side (lower surface) of the work which is held horizontally when transporting. Therefore, it is not possible to plate both sides of the work transported with holding vertically. Further, it is not possible to adopt the technique for a thin work, because a mass of processing solution Q is required to squirt the lower surface.

The present invention is aimed for processing surface treatment such as electroless plating in a high quality on the work which is held vertically.

SUMMARY OF THE INVENTION (1) A surface treating apparatus of this invention includes: a transport hanger for transporting a treatment object which is held vertically; a tank body for attaching processing solution interiorly to the treatment object which is transported by the transport hanger; a liquid squirting part for squirting the processing solution from a squirt port toward the treatment object obliquely upward to a horizontal plane; and a transport mechanism for transporting the transport hanger into the tank body.

This makes it possible to perform surface treatment such as electroless plating in a high quality on the work which is held vertically.

(2) The surface treating apparatus according to this invention is characterized in that a squirt angle of the processing solution is determined so that the processing solution squirted from the squirt port obliquely upward moves in a parabolic path, and the processing solution is attached to the treatment object in the vicinity of the vertex of the parabola.

This makes it possible to perform surface treatment such as electroless plating in a higher quality by attaching the squirted processing solution at the vicinity of the vertex of the parabola to the work which is held vertically.

(3) The surface treating apparatus according to this invention is characterized in that the liquid squirting part comprises a pipe member having an inner space, and the squirt port comprises a plurality of holes disposed at predetermined intervals along a longitudinal direction of the pipe member.

This makes it possible to perform surface treatment such as electroless plating in a higher quality by attaching the processing solution squirted from a plural of holes to the work which is held vertically.

(4) The surface treating apparatus according to this invention is characterized in that the liquid squirting part comprises a pipe member having an inner space, and the squirt port comprises a long hole extending in a longitudinal direction of the pipe member.

This makes it possible to perform surface treatment such as electroless plating in a higher quality by attaching the processing solution squirted from a long hole to the work which is held vertically.

(5) The surface treating apparatus according to this invention is characterized in that a redirection member is attached to an outer periphery of the liquid squirting part so as to overlap the squirt port, and the processing solution squirted from the squirt port is attached to the treatment object after hitting at the redirection member.

This makes it possible to perform surface treatment such as electroless plating in a higher quality by uniformizing the squirted processing solution and attaching it to the treatment object.

(6) The surface treating apparatus according to this invention is characterized in that the squirt angle of the processing solution squirted from the squirt port can be set to any angle.

This makes it possible to squirt the processing solution at a squirt angle set to any angle to the work which is held vertically.

(7) The surface treating apparatus according to this invention is characterized in that plural stages of the liquid squirting part are arranged inside of the tank body.

This makes it possible to attach the processing solution from plural stages of the liquid squirting part to a plate-like work.

(8) The surface treating apparatus according to this invention is characterized in that the squirt angle of the processing solution squirted from the squirt port is ranging from 5 degrees to 85 degrees upward to the horizontal plane.

This makes it possible to attach the squirted processing solution at an angle ranging from 5 degrees to 85 degrees upward to the horizontal plane to a plate-like work.

(9) The surface treating apparatus according to this invention is characterized by including an antiscattering member located vertically downward of the transport hanger.

This makes it possible to prevent the processing solution which has been run down the treatment object and dropped from attaching to the treatment object again by bouncing back.

(10) The surface treating apparatus according to this invention is characterized by including a liquid storage tank connected to the bottom of the tank body, wherein the bottom of the liquid storage tank is lower than the bottom of the tank body.

This makes it possible to allow the processing solution to flow into the liquid storage tank by itself. Also, this makes it possible to install a device such as a heater on the upper surface of the liquid storage tank and to facilitate the maintenance of the device.

(11) The surface treating apparatus according to this invention is characterized by including cutouts extending in a vertical direction on the tank body so that the treatment object pass through when the transport hanger is moved.

This makes it possible to transport the treatment object in a horizontal direction through the cutout and to save space.

(14) A surface treating apparatus of this invention includes: a transport hanger for transporting a treatment object which is held vertically; a tank body for attaching processing solution interiorly to the treatment object which is transported by the transport hanger; an antiscattering member located vertically downward of the transport hanger; and a transport mechanism for transporting the transport hanger into the tank body.

This makes it possible to prevent the processing solution which has been run down the treatment object and dropped from attaching to the treatment object again by bouncing back.

(15) A surface treating apparatus of this invention includes: a transport hanger for transporting a treatment object which is held vertically; a tank body for attaching processing solution interiorly to the treatment object which is transported by the transport hanger; a transport mechanism for transporting the transport hanger into the tank body; and a liquid storage tank connected to the bottom of the tank body, wherein the bottom of the liquid storage tank is lower than the bottom of the tank body.

This makes it possible to allow the processing solution to flow into the liquid storage tank by itself. Also, this makes it possible to install a device such as a heater on the upper surface of the liquid storage tank and to facilitate the maintenance of the device.

BRIEF DESCRIPTION OF THE DRAWINGS

FIG. 7 shows an improvement example that a redirection member 40 is added to the liquid squirting part 4.

FIGS. 14A and 14B show a structure of the liquid squirting part 4 according to another embodiment.

DETAILED DESCRIPTION OF DESIRED EMBODIMENTS

1. Structure of Surface Treating Apparatus 300

Figure 1:
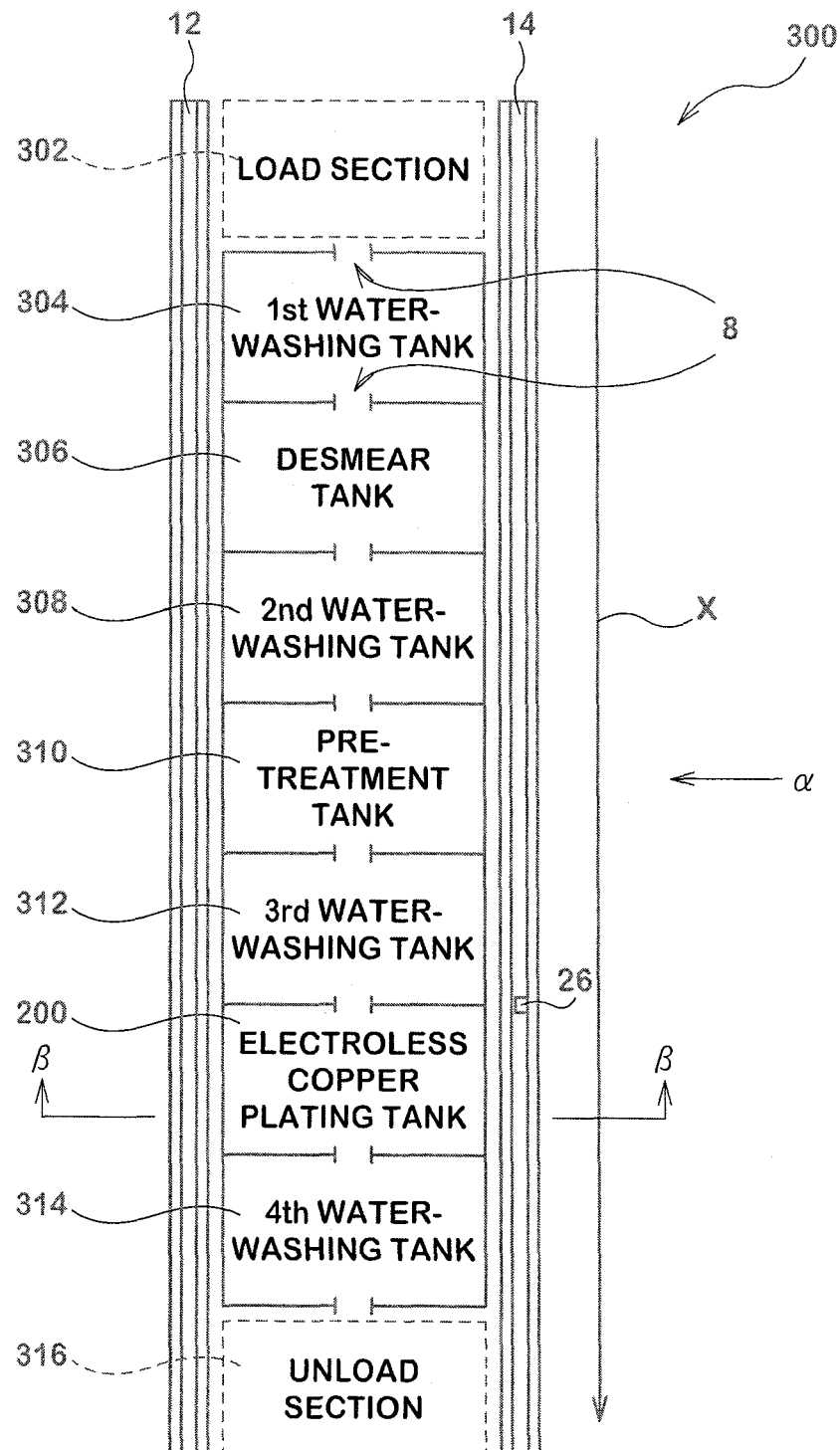
FIG. 1 is an arrangement plan of a surface treating apparatus 300 seen from above.
Figure 2:
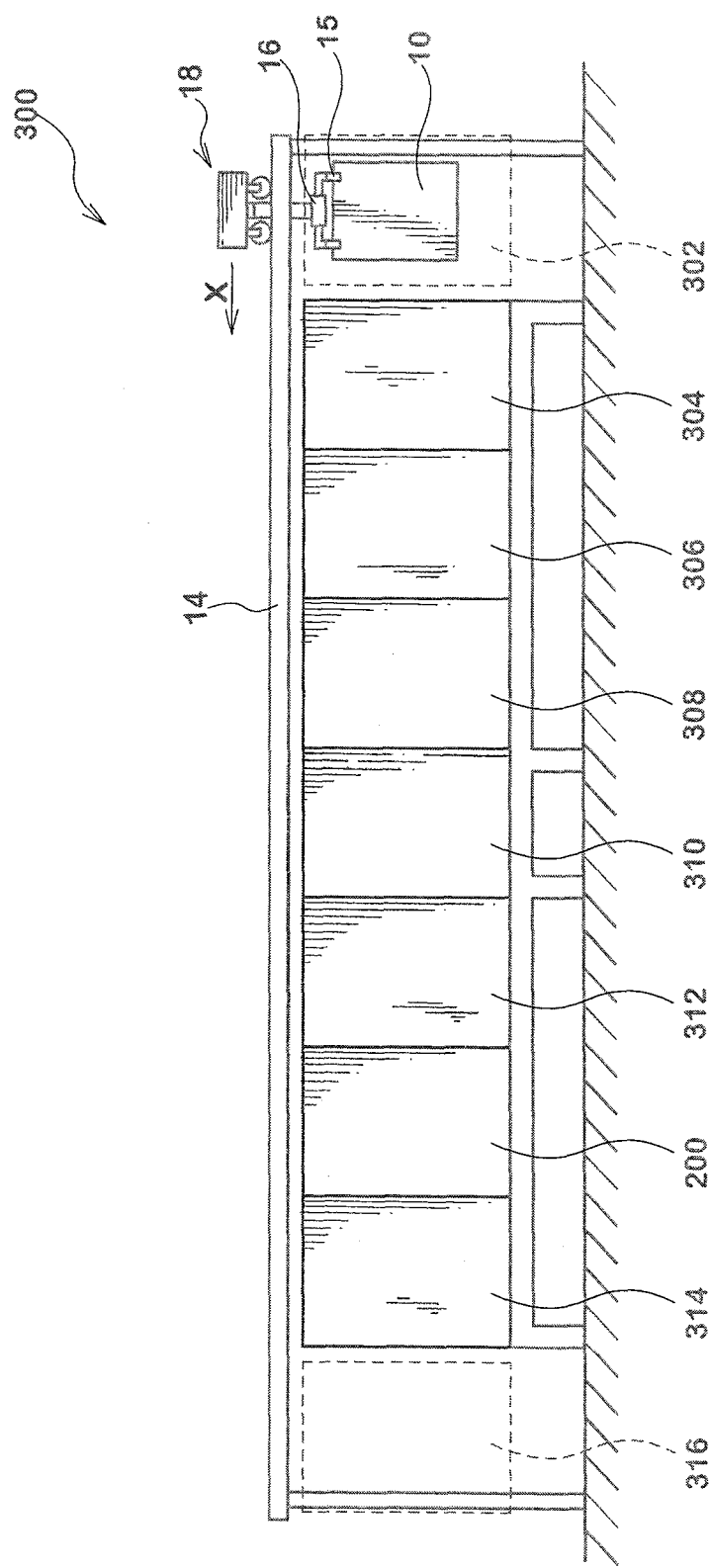
FIG. 2 is a side view of the surface treating apparatus 300 seen from α direction.

First, a structure of a surface treating apparatus 300 of the present invention will be described with reference to FIGS. 1 and 2. FIG. 1 is an arrangement plan of the surface treating apparatus 300 seen from above. FIG. 2 is a side view of the surface treating apparatus 300 shown in FIG. 1 seen from α direction. In FIG. 1, a transport hanger 16 and a transport mechanism 18 shown in FIG. 2 are omitted.

As shown in FIG. 1, along the transport direction X of a plate-like work 10 (FIG. 2) as a treatment object, the surface treating apparatus 300 includes a load section 302, a 1st water-washing tank 304, a desmear tank 306, a 2nd water-washing tank 308, a pre-treatment tank 310, a 3rd water-washing tank 312, an electroless copper plating tank 200, a 2nd water-washing tank 314, and an unload section 316 arranged in sequence. Each process for electroless copper plating is performed in this order. Each tank has cutout(s) 8 (FIG. 1) forming a passage of transport hanger 16 shown in FIG. 2. In addition, each process will hereinafter be described in detail.

Further, the surface treating apparatus 300 includes the transport hanger 16 for transporting the plate-like work 10 in a horizontal direction which is clamped by clamps 15 (FIG. 2) and held vertically, and the transport mechanism 18 for transporting the transport hanger 16 into each tank. FIG. 2 indicates a state that plate-like work 10 is attached to the transport hanger 16 at a load section 302.

After the plate-like work 10 is attached at a load section 302, the transport mechanism 18 starts to move in the horizontal direction X, thereby the plate-like work 10 pass through inside of each tank (electroless copper plating tank 200, etc.). Eventually, the transport mechanism 18 stops at the unload section 316, and the plate-like work 10 that plating has been performed is detached from the transport hanger 16.

Figure 3:
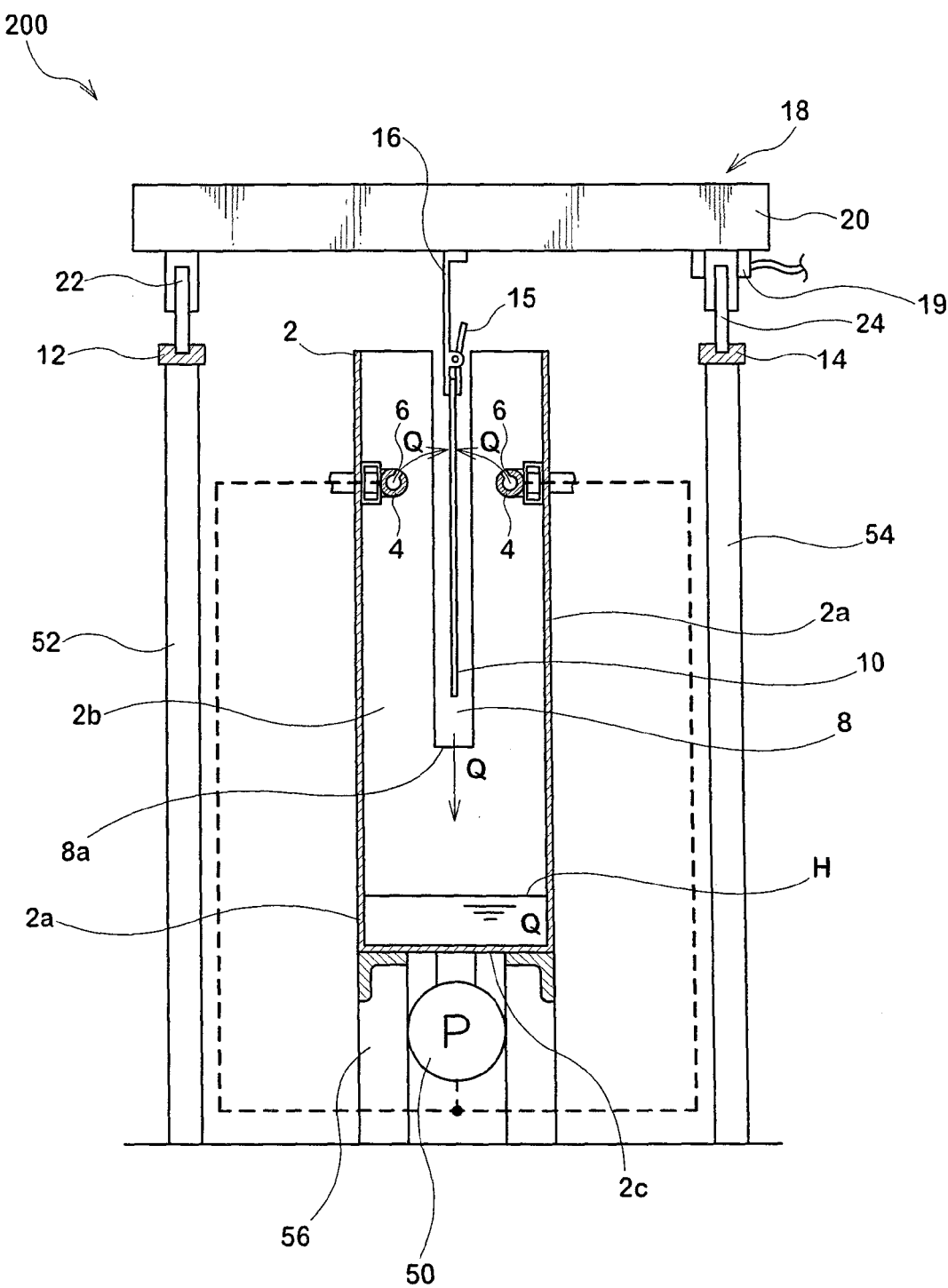
FIG. 3 is a cross-sectional view taken along the line β-β of an electroless copper plating tank 200 that forms a part of the surface treating apparatus 300.
Figure 4:
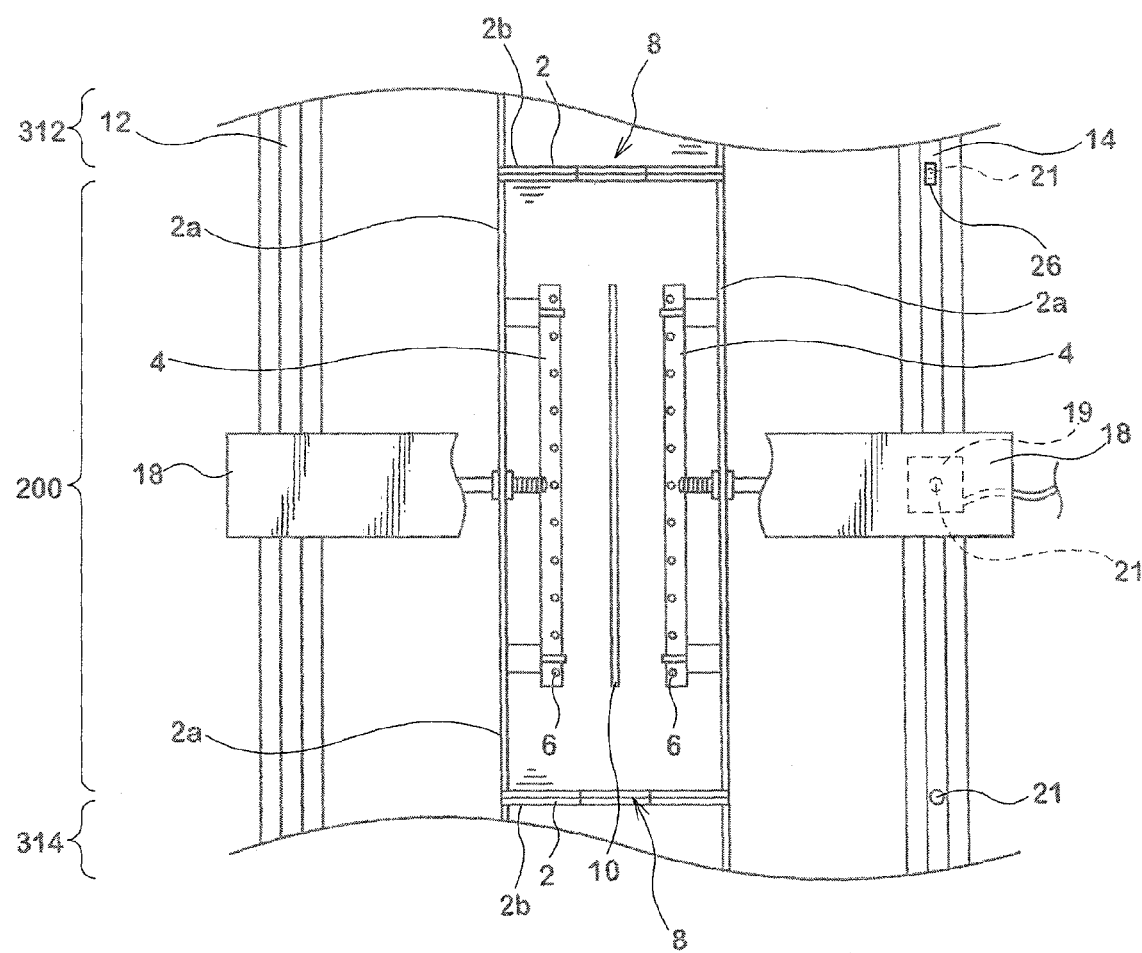
FIG. 4 is a view of the electroless copper plating tank 200 seen from above.

FIG. 3 is a cross-sectional view taken along the line β-β of the electroless copper plating tank 200 (FIG. 1) that forms a part of the surface treating apparatus 300. FIG. 4 is a view of the electroless copper plating tank 200 shown in FIG. 3 seen from above. The transport hanger 16 and the transport mechanism 18 are omitted in FIG. 4.

The electroless copper plating tank 200 shown in FIG. 3 includes a tank body 2 mounted on the frame 56 and a circulation pump 50 for circulating the processing solution Q (electroless copper plating solution) accumulated on the bottom in the tank body 2 by supplying with the liquid squirting part 4.

For performing a process on the plate-like work 10, a liquid squirting part 4 which has a squirt port 6 is arranged inside of each tank such as the electroless copper plating tank 200. As shown in FIG. 3, the processing solution is squirted from the squirt port 6 of the liquid squirting part 4 toward the plate-like work 10 obliquely upward to a horizontal plane.

Therefore, the processing solution Q (electroless copper plating solution) is attached to the upper side of the plate-like work 10 which is clamped by the transport hanger 16 inside of the tank body 2. Accordingly, it becomes possible to attach the processing solution Q to the surface of the plate-like work 10 while the processing solution Q is running down the plate-like work 10. In addition, the structure of the liquid squirting part 4 will hereinafter be described in detail.

Thus, a system is employed that circulated processing solution Q runs down the plate-like work 10 without dipping the plate-like work 10 into stored processing solution Q. Therefore, it becomes possible to reduce the total amount of the processing solution Q used for the surface treating apparatus 300 in whole as compared with a dipping type.

The transport mechanism 18 includes the guide rails 12, 14, a support member 20, and the transport rollers 22, 24 shown in FIG. 3. At the bottom of the support member 20, the transport rollers 22, 24 are installed for movement of the transport mechanism 18 on the guide rails 12, 14. The transport rollers 22, 24 are powered by a motor (not shown). Each of guide rails 12, 14 are fixed on the frames 52, 54. As the plate-like work is transported in such a horizontal direction, there is no need to move up and down. Therefore, it becomes possible to save space because the height of apparatus can be lowered.

As shown in FIG. 3, the transport hanger 16 is fixed below the support member 20 so as to be suspended between two guide rails 12, 14. This makes it possible to reduce a vibration of the plate-like work 10, and also possible to reduce a distortion of structural objects (such as guide rails 12 and 14, frames 52 and 54, etc.) which support the transport mechanism 18.

Also, a plural of magnets 21 are embedded at a predetermined location on the guide rails 12, 14 shown in FIG. 4. The transport mechanism 18 has a magnetic sensor 19 for detecting the magnet 21 on the guide rails 12, 14. The magnetic sensor 19 is installed on the lower side of the support member 20 (one place of the guide rail 14's side).

This allows the transport hanger 16 transported into the electroless copper plating tank 200 to stop at a predetermined location (for example, at the center position of the electroless copper plating tank 200 shown in FIG. 4).

As shown in FIG. 3, the circulation pump 50 installed for each tank is connected to the bottom of the tank body 2, and between the tank body 2 and the liquid squirting part 4 are connected through the circulation pump 50 (indicated by the dotted arrow). This makes it possible to provide the liquid squirting part 4 with the processing solution Q accumulated in the bottom of the tank body 2 again by means of circulation pump 50.

The tank body 2 includes side walls 2a, 2b and bottom 2c, and is formed by assembling these materials such as PVC (polyvinyl chloride) with the use of processing, adhesion, etc., in one united body. The processing solution attached to the plate-like work 10 is received on a downward bottom 2c of the tank body 2. In addition, the tank body 2 of the same shape is also used for each tank shown in FIG. 1 other than the electroless copper plating tank 200. That is to say, the structure of each tank is the same, but the type of the processing solution (plating liquid, desmear liquid, washing water) used for each tank is different.

Also, a slit 8 as a cutout is formed so as to extend in a vertical direction on the side wall 2b of the tank body 2 shown in FIG. 3. This makes the plate-like work 10 possible to go through the slit 8 when the transport hanger 16 is transported. In addition, if the lower end 8a of the slit 8 is too low, the processing solution Q accumulated in the tank body 2 may be overflowed or flowing out Therefore, it is required to adjust the supplied amount of the processing solution Q so that the liquid level H (FIG. 3) of the processing solution Q accumulated in the tank body 2 is constantly placed at a position lower than lower end 8a of the slit 8. In this embodiment, such a problem is resolved by determining the amount of the processing solution Q so that the liquid level H (FIG. 3) of the processing solution Q accumulated in the tank body 2 is constantly placed at a position lower than lower end 8a of the slit 8, and by connecting the tank body 2 and the liquid squirting part 4 through a circulation pump 50.

[Structure of the Liquid Squirting Part 4]

Figure 5:
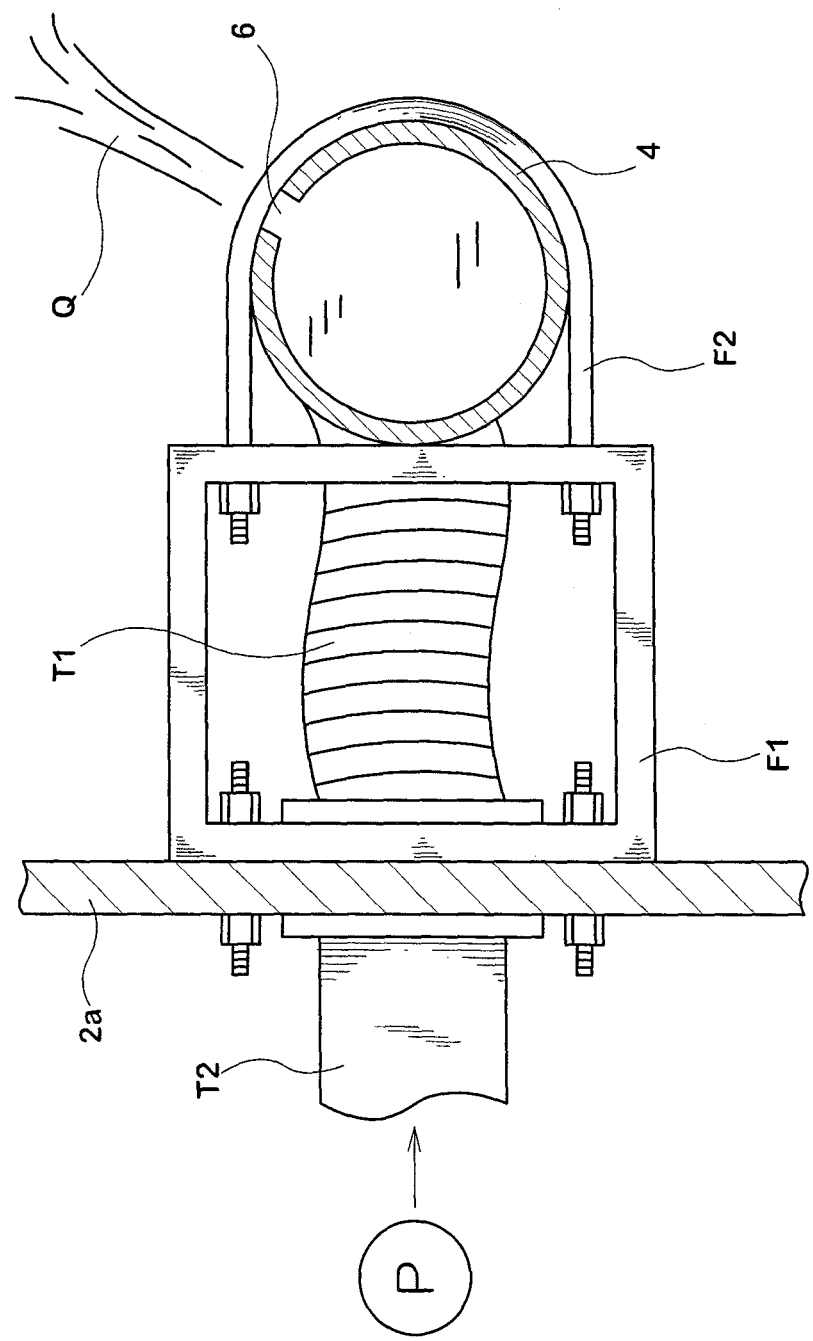
FIG. 5 shows the structure of liquid squirting part 4.

FIG. 5 shows the structure of the liquid squirting part 4. FIG. 5 is an enlarged view of the liquid squirting part 4 shown in FIG. 3.

As shown in FIG. 5, the liquid squirting part 4 is installed on a base F1, which is configured by fixing a square pipe to the side wall 2a, by fastening with the use of two U-shaped fasteners F2. In this embodiment, the liquid squirting part 4 is fastened with the strength to be capable of manually rotating.

As shown in FIG. 4, the liquid squirting part 4 is comprised of a round pipe as a pipe member which has an internal space. Both sides of its longitudinal direction are sealed. Also, the squirt port 6 comprises a plural of holes disposed at predetermined intervals along a longitudinal direction. Further, a flexible pipe T1 and a pipework T2 are connected to the liquid squirting part 4. The flexible pipe T1 and the pipework T2 penetrates through the side wall 2a of the tank body. The pipework T2 is connected to a discharge port of the pump 50. Therefore, it is possible to squirt the processing solution Q fed from the pump 50 through the squirt port 6.

Figure 6B:
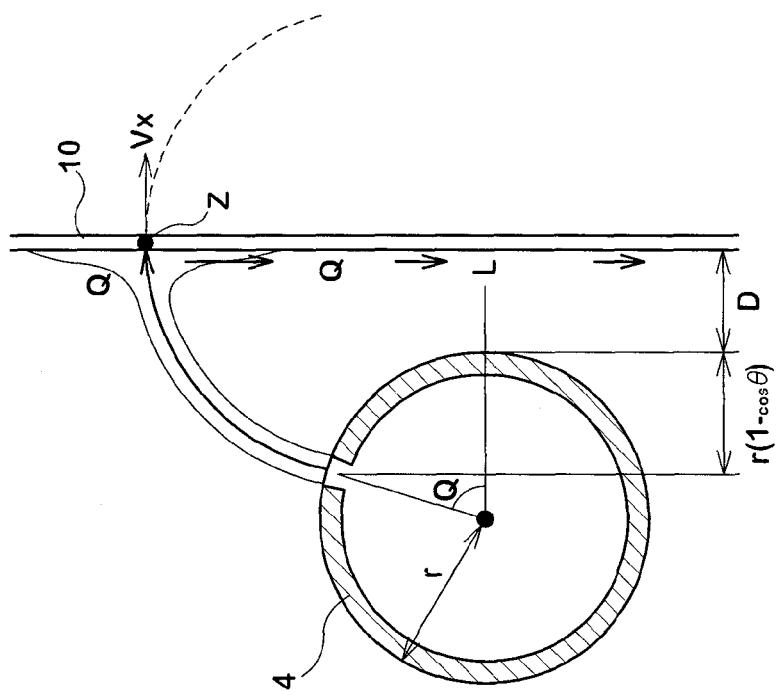
FIGS. 6A and 6B show a current of the processing solution Q squirted from a squirt port 6 of the liquid squirting part 4.
Figure 6A:
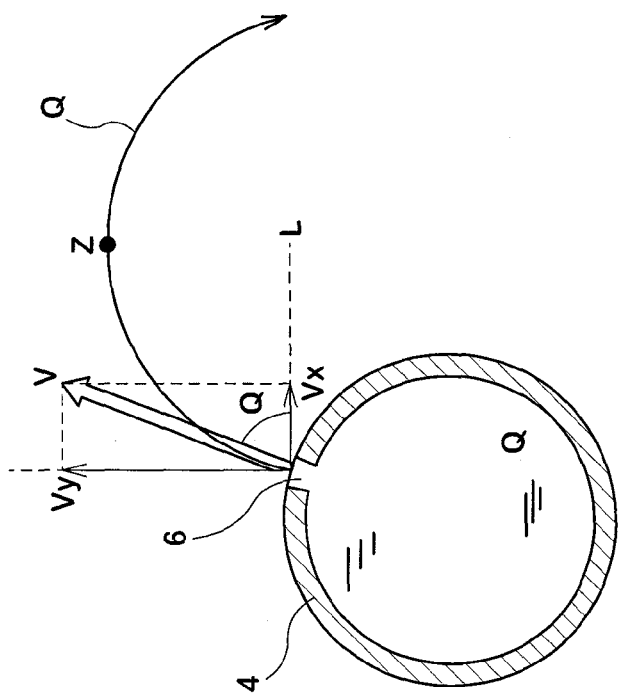

As shown in FIG. 6A, a squirt angle $\theta$ of the squirt port 6 is set obliquely upward to the horizontal plane L (for example, ranging from 5 degrees to 85 degrees). Therefore, a liquid current of the processing solution Q squirted from the squirt port 6 moves in a parabolic path. A position of a vertex Z can be determined from a squirt current velocity V and the squirt angle $\theta$ of the processing solution Q. In addition, the squirt current velocity V of the processing solution Q depends on the pressure from the pump 50 and the size of the squirt port 6.

In this embodiment, the squirt angle $\theta$ is designed so that the processing solution Q squirted at squirt current velocity V can hit against the plate-like work 10 at the vertex Z of the parabola under a condition that the liquid squirting part 4 (radius r) is separated at a predetermined distance D from the plate-like work 10. It becomes possible to inhibit bubbling at the vertex Z of the parabola shown in FIG. 6B. Because the vertical component of velocity Vy of the processing solution Q vanishes, and the horizontal component of velocity Vx (equal to the horizontal component of velocity when it is squirted) only remains.

In addition, as the liquid current hits perpendicular to a surface of the plate-like work 10, the processing solution Q attached to the plate-like work 10 spreads on the surface concentrically and uniformly. Further, it is possible to hit the vicinity of the vertex Z, i.e., forward or backward from the vertex Z by a predetermined distance.

If the processing solution Q is squirted in a horizontal direction or below than the horizontal direction without squirting obliquely upward to the horizontal plane L, the vertical component of velocity Vy of the processing solution Q continues to increase, and the synthesized velocity V also continues to increase by an amount corresponding to it. Accordingly, bubbles occur easily because the processing solution Q attached to the plate-like work 10 scatters in y direction.

As the mentioned above, the occurrence of bubbles when striking the work can be suppressed by squirting the processing solution obliquely upward to the horizontal plane L. This makes it possible to prevent from increasing the amount of the dissolved oxygen in the processing solution Q.

In addition, as shown in FIG. 7, a redirection member 40 may be attached to an outer periphery of the liquid squirting part 4 so as to overlap the squirt port 6 for changing the direction of the processing solution Q. Further, the redirection member 40 is spaced from the squirt port 6.

Figure 8A:
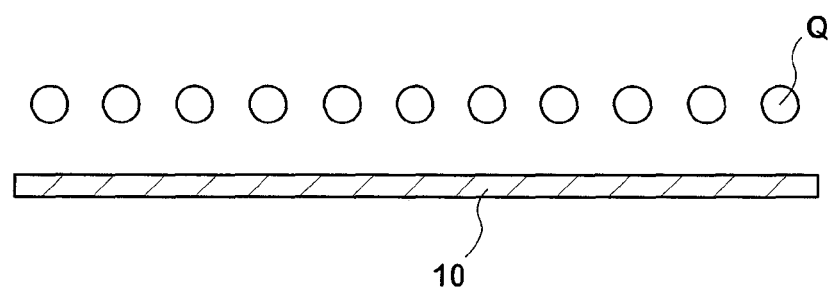
FIGS. 8A and 8B are cross-sectional views of a liquid current of the processing solution Q before or after attaching to the redirection member 40.
Figure 8B:
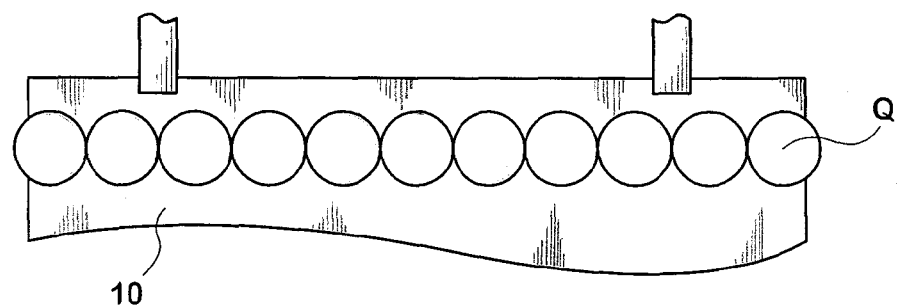

FIG. 7 is an enlarged view illustrating a state that the direction of squirted processing solution Q is redirected by a redirection member 40. FIG. 8A is $\gamma 1$ cross-section view of squirted processing solution Q (before hitting on the redirection member 40). FIG. 8B is $\gamma 2$ cross-section view of the processing solution Q after hitting on the redirection member 40).

If the redirection member 40 is used, the area of liquid flow (section area shown in FIG. 8A) becomes bigger as it hit the redirection member (FIG. 8). Therefore, the liquid flow from each of nearby squirt port 6 are combined (FIG. 8) when attaching to the plate-like work 10, thereby it is possible to uniformize the processing solution Q which is attached to the surface of the plate-like work 10.

Figure 21:
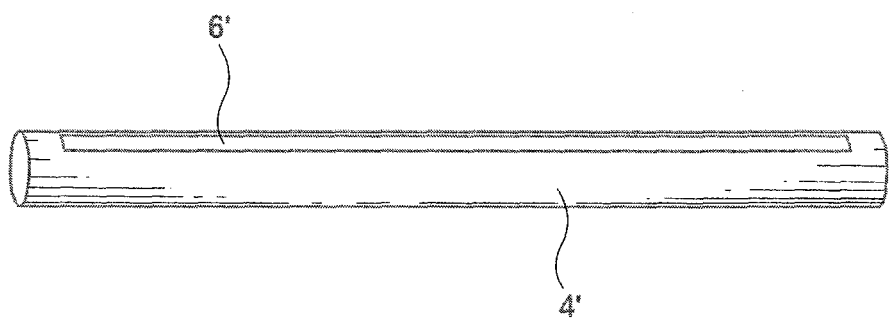
FIG. 21 shows a liquid squirting part 4' according to another embodiment.

That is to say, ideally, it is possible to uniformize the liquid flow like a liquid flow squirted through a slit (a long hole) shown in FIG. 21. Also, to describe a parabola as well as the liquid flow squirted through a slit (a long hole), the width of the slit is needed to be narrowed (Because, it is required to attain the same flow rate when squirting that an area of the slit is the same as the sum of area of holes). However, there is a disadvantage that it may be clogged easily. Therefore, holes are formed to achieve the same effect as a slit.

2. Each Processing in the Surface Treating Apparatus 300

Referring to FIG. 9 etc., each process of the surface treating apparatus 300 will be described. In this embodiment, the processing solution Q used for each tank of the surface treating apparatus 300 is constantly circulated by the circulation pump 50 in each tank.

Figure 9A:
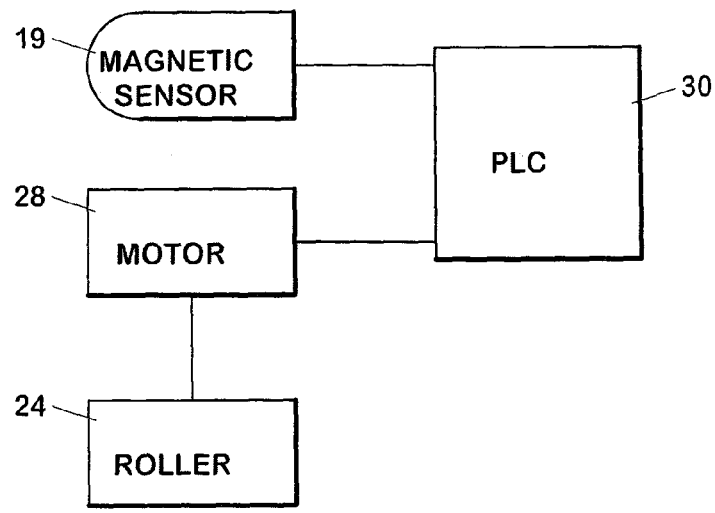
FIG. 9A shows a relation of connection for controlling of transferring movement of a transport mechanism 18.

FIG. 9A shows a relation of connection for controlling transferring movement of the transport mechanism 18. As shown in FIG. 9A, the magnetic sensor 19 (FIG. 4) is connected to a PLC 30, and detects that it is arrived above the magnet which is arranged on the guide rail 14. A signal that the magnetic sensor 19 has been detected is sent to the PLC 30. After receiving a signal, the PLC 30 controls movements (forward, backward, and stop, etc.) of the transport rollers 22, 24 by switching on/off the motor 28.

At first, at the load section 302 shown in FIG. 1, an operator or an installation device (not shown) attaches a plate-like work 10 to be plated to the transport hanger 16 (a state shown in FIG. 2).

Then, as the operator push a transport switch (not shown), the transport hanger 16 moves into the 1st water-washing tank 304 along the guide rails 12, 14. That is, the PLC 30 controls the transport rollers 22, 24 so as to move forward by switching on the motor 28.

Next, at the 1st water-washing tank 304, water-washing a process is performed by applying water to the plate-like work 10 from both sides. The transport hanger 16 stops at the 1st water-washing tank 304 for a predetermined time, then, moves into the desmear tank 306.

For example, after receiving a signal from the magnetic sensor 19 that indicates an arrival at the center of the water-washing tank 304, the PLC 30 controls the motor 28 so as to stop for one minute. Then, the PLC 30 controls the transport rollers 22, 24 so as to move forward by switching on the motor 28. Also, a similar control is performed at the 2nd water-washing tank 308, the 3rd water-washing tank 312, and the 4th water-washing tank 314.

At the desmear tank 306, the transport hanger 16 stops for a predetermined time (for example, 5 minutes), and desmear processing solution (swelling conditioner, resin etching solution, and neutralizing solution, etc.) is applied to the plate-like work 10 from both sides. Here, the desmear process is a process to remove smear (resin) which remains on the plate-like work 10 upon machining such as making a hole, etc.

For example, after receiving a signal from the magnetic sensor 19 that indicates an arrival at the center of the desmear tank 306, the PLC 30 controls the motor 28 so as to stop for five minutes. Then, the transport rollers 22, 24 move forward by switching on the motor 28. A similar process is performed at the pre-treatment tank 310.

Next, at the 2nd water-washing tank 308, water-washing process is performed by applying water to the plate-like work 10 from both sides. The transport hanger 16 stops at the 2nd water-washing tank 308 for a predetermined time (for example, 1 minute), then, moves into the pre-treatment tank 310.

At the pre-treatment tank 310, the transport hanger 16 stops for a predetermined time (for example, for 5 minutes), and the pre-treatment solution is applied to the plate-like work 10 from both sides.

Next, at the 3rd water-washing tank 312, water-washing process is performed by applying water to the plate-like work 10 from both sides. The transport hanger 16 stops at the 3rd water-washing tank 312 for a predetermined time (for example, 1 minute).

Then, until arriving at the electroless copper plating tank 200 (FIGS. 3 and 4), it repeats the back and forth movement a predetermined number of times as mentioned below. The processing solution Q may not be reached to the plate-like work 10 because air (bubble) remains there, if there are holes such as through holes, etc. on the plate-like work 10. Therefore, it is required to remove air (bubble) before performing an electroless copper plating process.

Figure 9B:
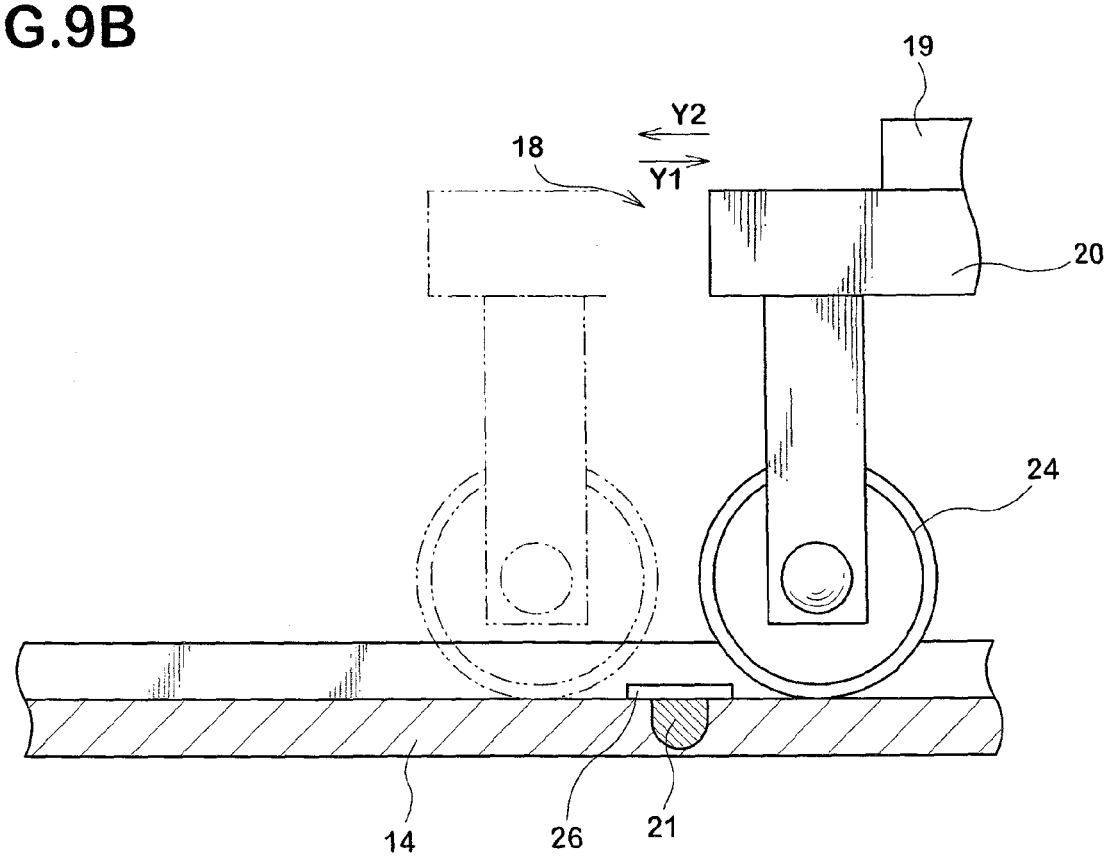
FIG. 9B shows a cross-section surface of a guide rail 14 between the 3rd water-washing tank 312 and the electroless copper plating tank 200.

FIG. 9B shows a cross-section surface of the guide rail 14 between the 3rd water-washing tank 312 and the electroless copper plating tank 200 (FIG. 1). As shown in FIGS. 9B and 1, one convex part 26 as an impact generator is formed on the guide rail 14. It is possible to drain off the processing solution Q by an impact caused when the transport roller 24 climbed over this convex part 26.

For example, after receiving a signal which indicates that the magnet 21 shown in FIG. 9B is arrived at the center (that is, the convex part 26 is climbed over by the transport roller 24), the PLC 30 controls the motor 28 so that the transport rollers 22, 24 move backward a predetermined distance (Y1 direction shown in FIG. 9B). Then, the transport rollers 22, 24 move forward until detecting the magnet 21 (Y2 direction shown in FIG. 9B). After repeating the above-mentioned back and forth movement a predetermined number of times (for example, 3 times back and forth), it stops at the center of the electroless copper plating tank 200 (FIG. 4).

The transport hanger 16 stops for a predetermined time in the electroless copper plating tank 200, and electroless copper plating solution is applied to the plate-like work 10 from both sides.

For example, the PLC 30 brings the motor 28 to a halt for 5 minutes after receiving a signal from the magnetic sensor 19 that indicates the arrival at the center of the electroless copper plating tank 200. Then, the transport rollers 22, 24 move forward by switching on the motor 28.

Then, at the 4th water-washing tank 314, a water-washing process is performed by applying water to the plate-like work 10 from both sides. The transport hanger 16 stops at the 4th water-washing tank 314 for a predetermined time (for example, 1 minute), after that, it is transferred to the unload section 316.

At last, the transport hanger 16 transferred to the unload section 316 stops. For example, the PLC 30 brings the motor 28 to a halt after receiving a signal from the magnetic sensor 19 that indicates the arrival at the unload section 316. After that, the plate-like work 10 is unloaded by the operator, etc. In this way, a series of the electroless plating process will be completed.

3. Structure of the Other Plating Tanks 201, 202

Figure 10:
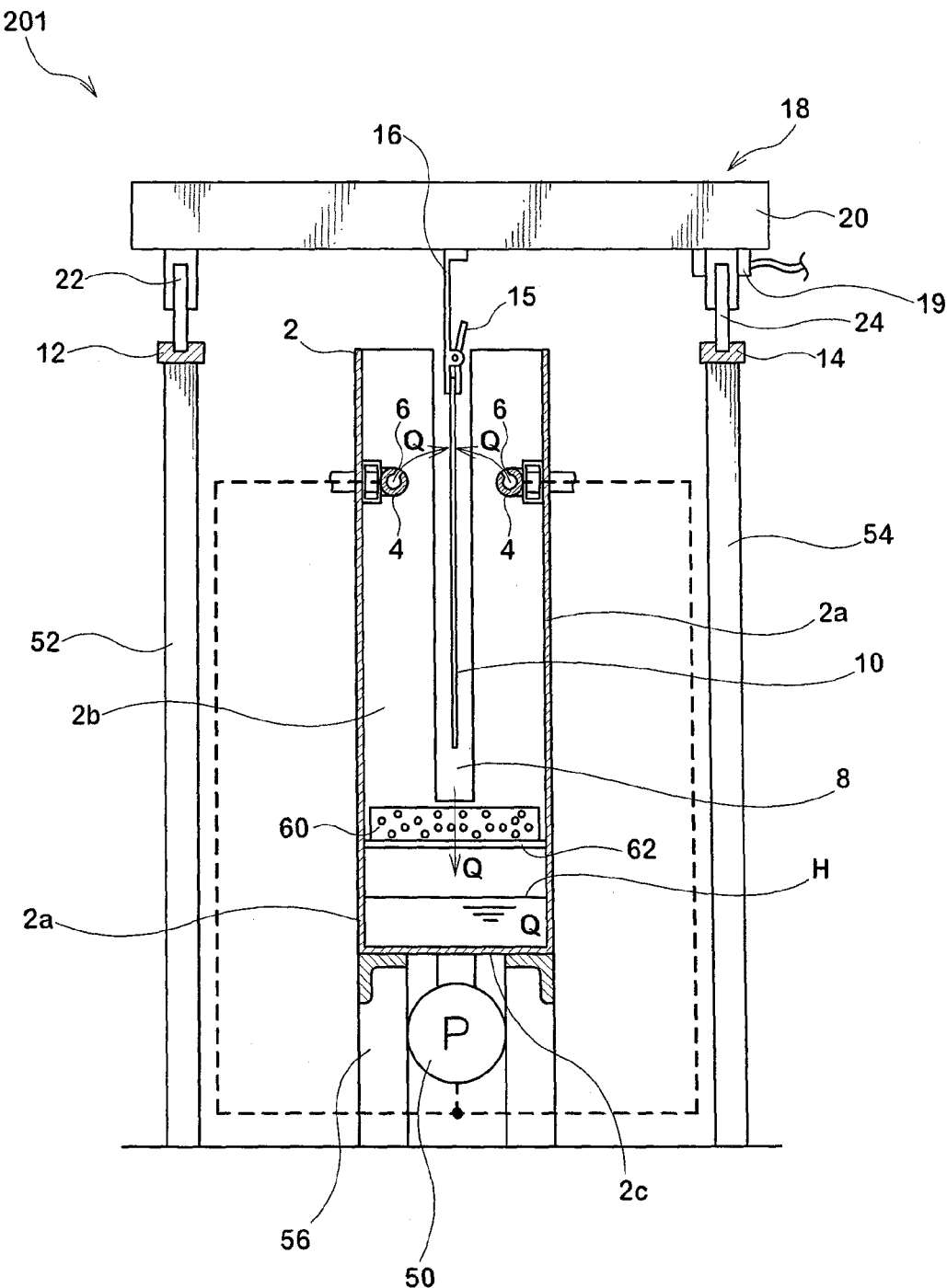
FIG. 10 shows a structure of the plating tank 201 according to another embodiment.

(a) In the above embodiments, the processing solution Q which has been running down the plate-like work 10 and dropped may be received by an antiscattering member located vertically downward of the transport hanger 16, as shown in FIG. 10. FIG. 10 shows an example that the antiscattering member 60 is added to the plating tank 200.

This makes it possible to prevent the processing solution from scattering through a transport slit, and from bouncing back to the plate-like work. For example, a sponge, a filter, a fibrous material (Chemical Fiber Lock made by TOYO CUSHION CO., LTD. (Trademark)) made of resin which is excelled in chemical resistance and heat resistance can be used.

Figure 11:
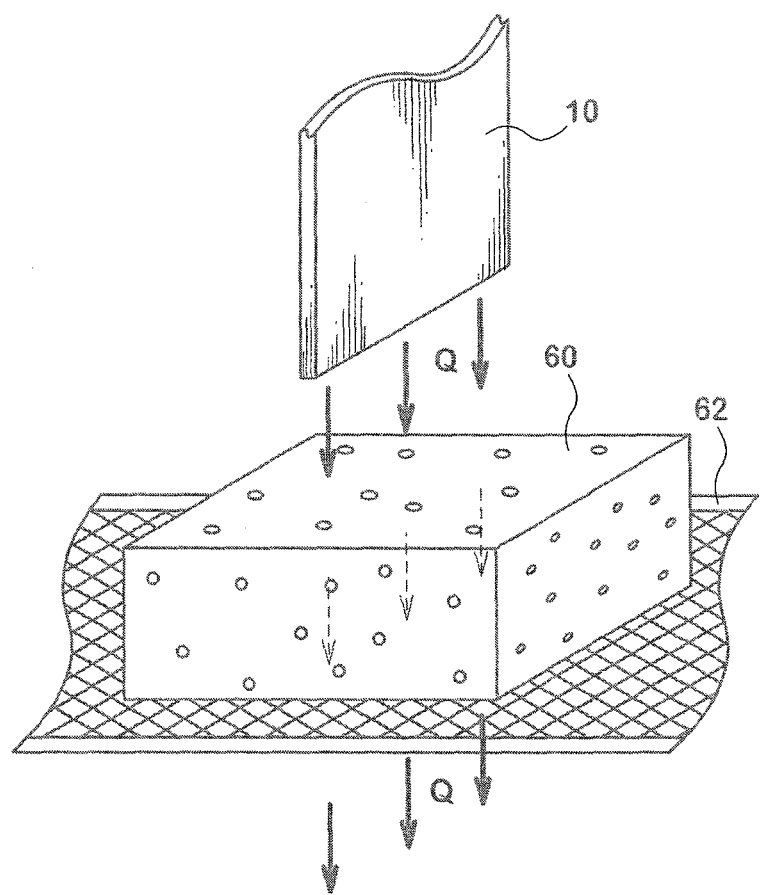
FIG. 11 shows the detail of the antiscattering member 60.

FIG. 11 illustrates the structure of the antiscattering member 60 and the movement of the processing solution Q.

As shown in FIG. 11, the antiscattering member 60 is held from underneath by a support part 62 including net materials. Therefore, after being received by the antiscattering member 60, the dropped processing solution Q permeates the antiscattering member 60 and falls into a lowly-placed liquid surface. Because baunceXbacks are received by the lower side of the antiscattering member 60, it does not reach to the plate-like work 10 when dropping into the liquid surface.

(b) In the above embodiments, the processing solution Q which has been running down the plate-like work 10 is accumulated in the tank body 2. However, as shown in FIG. 12, a liquid storage tank 3 may be provided separately by connecting to the bottom of the tank body 2, and the processing solution Q may be accumulated inside of this liquid storage tank 3.

Figure 12:
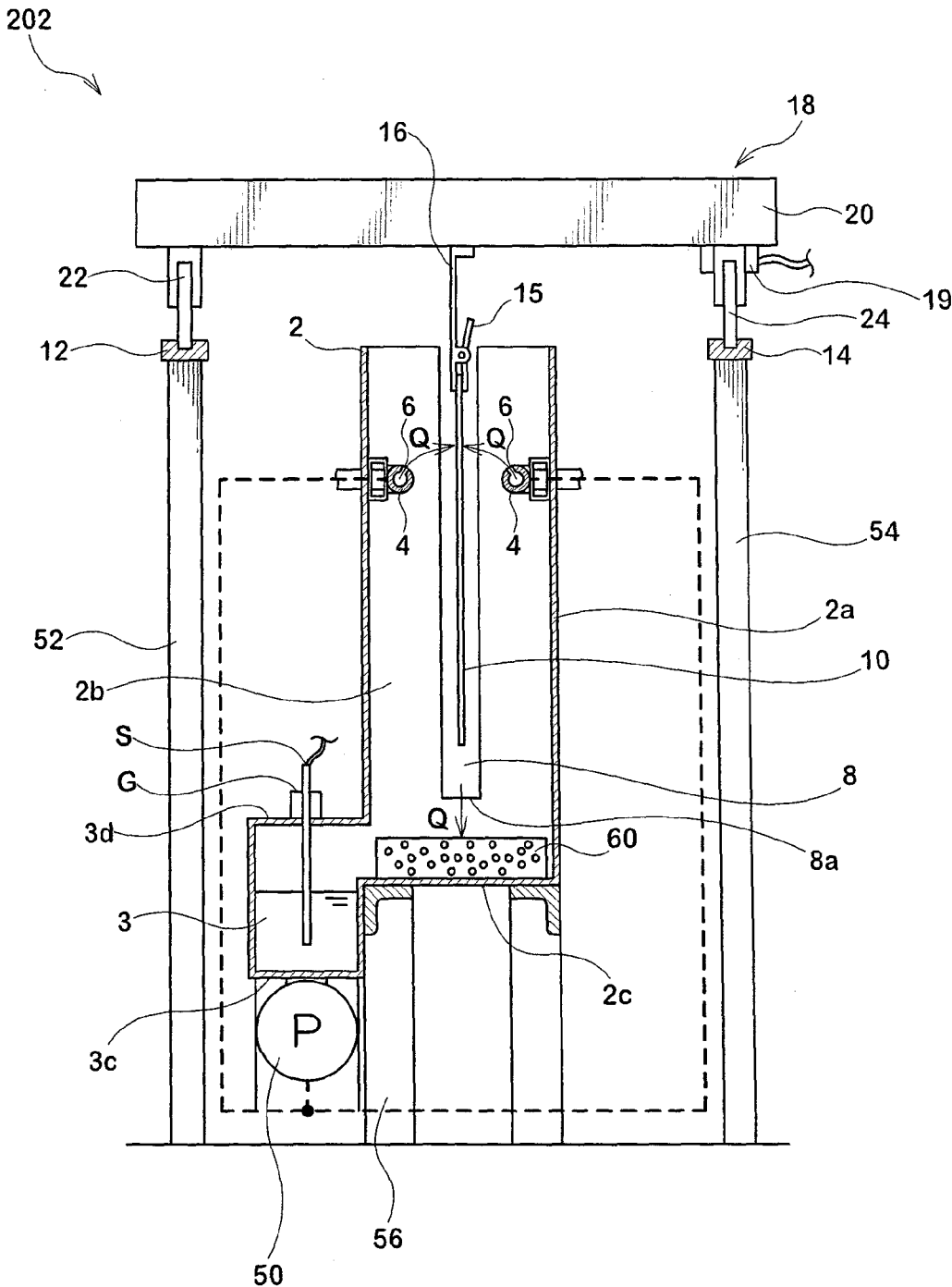
FIG. 12 shows a structure of the plating tank 202 according to another embodiment.

FIG. 12 shows an example that the liquid storage tank 3 is added to the plating tank 201 shown in FIG. 10. In this embodiment, the difference from the embodiment of FIG. 10 is that the antiscattering member 60 is directly arranged on the bottom 2c of the tank body.

The bottom 3c of the liquid storage tank that the plating tank 202 has is positioned lower than a bottom 2c of the tank body. Therefore, it is possible to allow the processing solution Q to flow into the inside. By connecting a lateral storage part to the bottom of the tank body and arranging adjacently, a device S such as a heater, a level sensor, and a stirring machine can be easily mounted on the upper surface 3d of the lateral storage part. In FIG. 12, the device S is inserted into the upper surface 3d of the liquid storage tank 3 detachably while it is fixed to the ring G so as not to drop down. Therefore, it is possible to remove it instantly in maintenance (for example, when peeling off plating attached to the heater). In addition, the antiscattering member 60 may be omitted from the structure shown in FIG. 12.

4. Other Embodiment

In the above embodiments, the liquid squirting part 4 is attached to the tank body 2. However, the liquid squirting part 4 may be attached to the others such as the frames 52, 54.

In the above embodiments, the squirt port 6 is formed by round holes. However, it may be formed by the other shape such as a polygonal shape. For example, the squirt port 6' may be formed by a long slit shown in FIG. 21.

Figure 13:
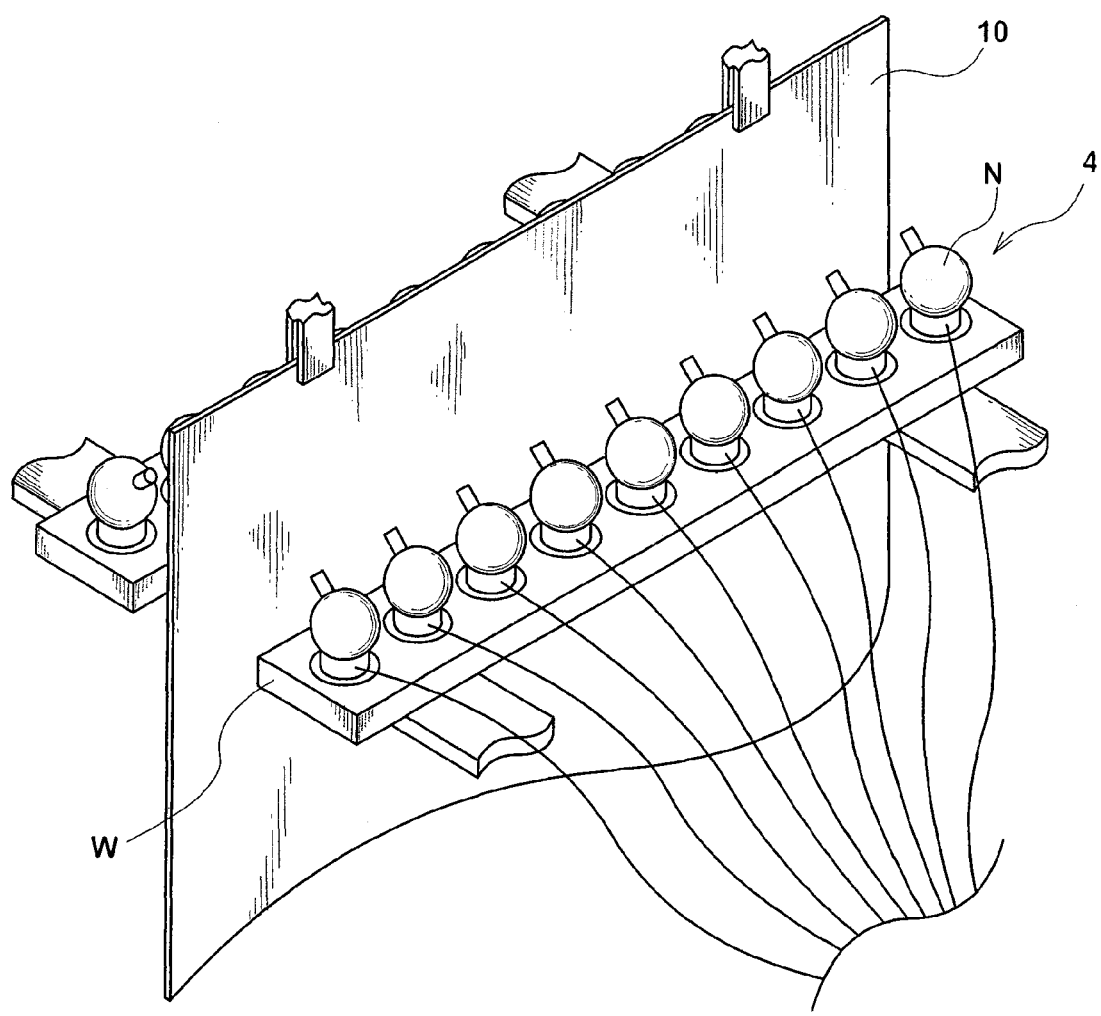
FIG. 13 shows a structure of the liquid squirting part 4 according to another embodiment.

In the above embodiments, a plural of squirt ports 6 are arranged on the liquid squirting part 4. However, as shown in FIG. 13, it may be formed by arranging a plural of nozzles N which has the squirt port 6 respectively on the attachment plate W.

In the above embodiments, the liquid squirting part 4 is made from a cross-sectionally circular pipe. However, it may be made from the other shape such as a cross-sectionally square pipe.

In the above embodiments, the angle of the squirt port 6 is set to any angle by rotating the liquid squirting part 4. However, as shown in FIGS. 14A and B, the angle of squirt port 6 may be set to any angle by rotating a cover 4b (including a slit 6") which covers the liquid squirting part 4a so as to be slidable and includes holes (6a, 6b, 6c) arranged on the liquid squirting part 4 corresponding to a plural of angles. FIG. 14B is a cross-sectional view of the liquid squirting part 4a shown in FIG. 14A in the vicinity of the holes 6a, 6b, and 6c.

In the above embodiments, the angle of the redirection member 40 is fixed. However, the angle of the redirection member 40 may be set to any angle.

In the above embodiments, the surface treating apparatus is stated as a horizontally moving type. However, the surface treating apparatus may be a lift type.

In the above embodiments, the surface treating apparatus 300 includes a plural of tanks (Such as the 1st water-washing tank 304, the desmear tank 306, the pre-treatment tank 310, and the electroless copper plating tank 200 shown in FIG. 1). However, the surface treating apparatus 300 may include at least any one tank of them.

Figure 15:
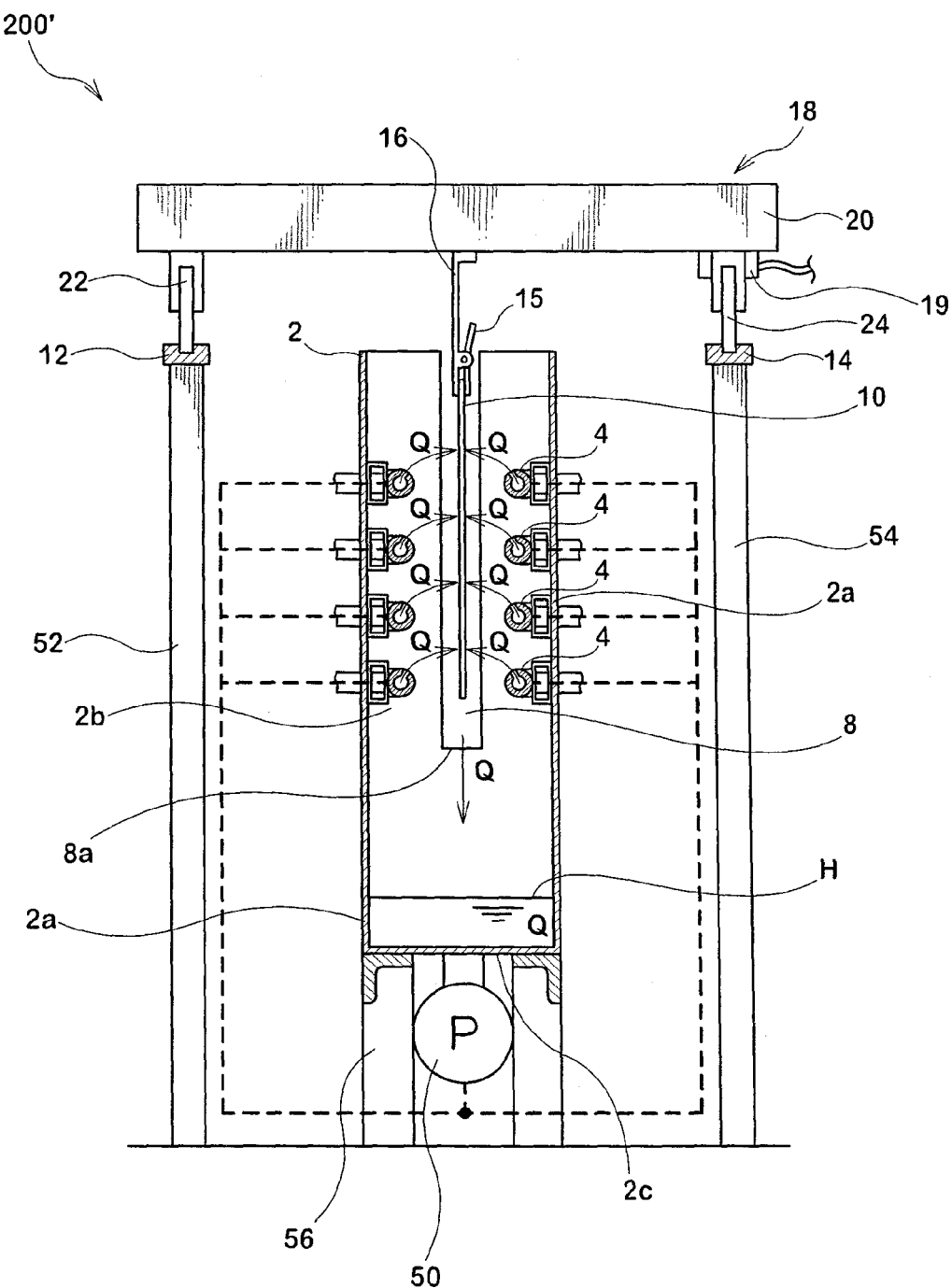
FIG. 15 shows an example illustrating that plural stages of the liquid squirting part 4 are arranged.

In the above embodiments, one liquid squirting part 4 is arranged in the tank body 2. However, plural stages of the liquid squirting part 4 may be arranged. FIG. 15 shows an example of an electroless copper plating tank 200' illustrating that four stages of the liquid squirting part 4 are arranged in a vertical direction.

Figure 16:
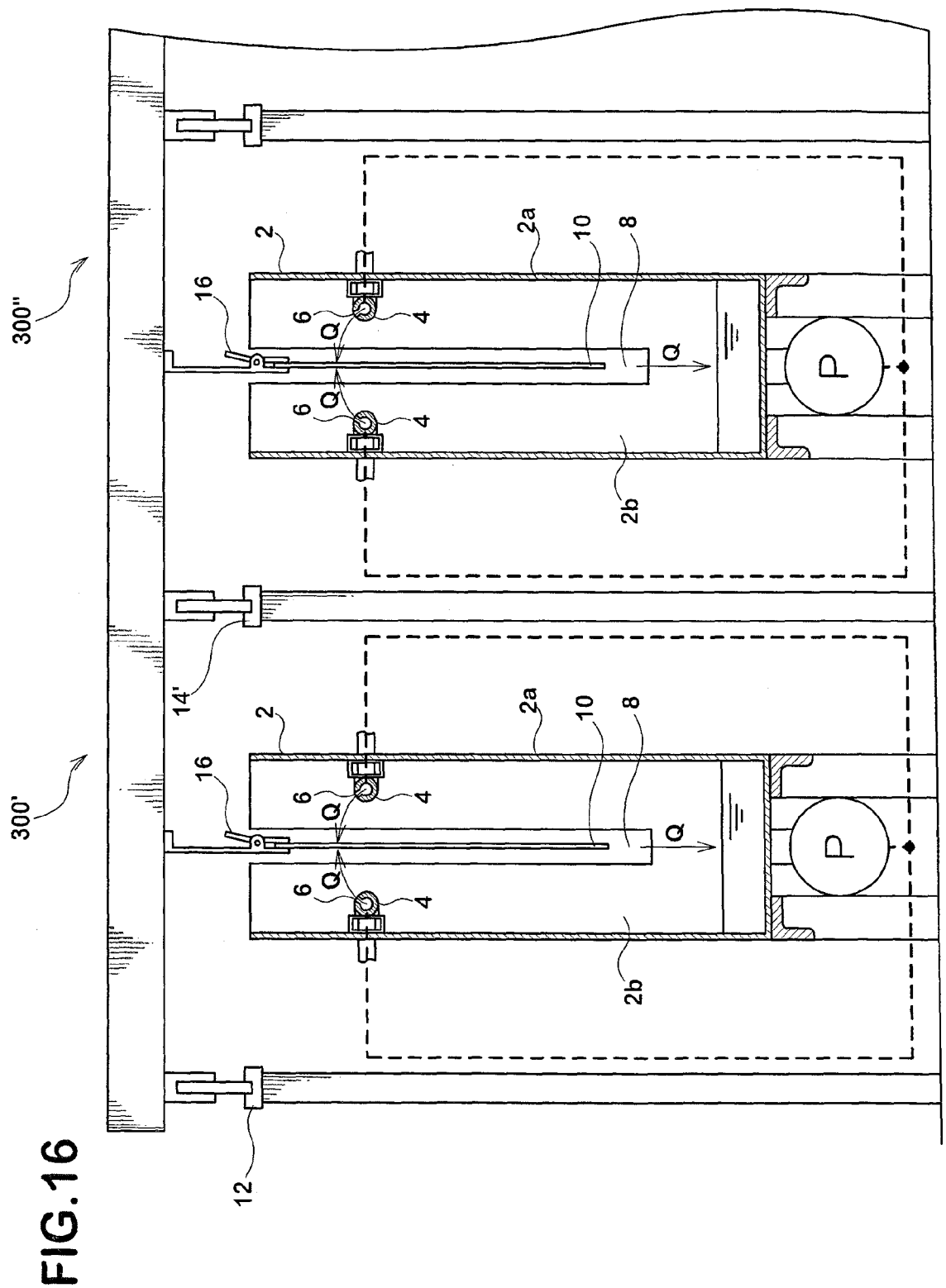
FIG. 16 shows an example illustrating that the surface treating apparatuses are adjacently arranged in plural rows.

In the above embodiments, the surface treating apparatus 300 is arranged on a straight line in the transport direction x. However, as shown in FIG. 16, the surface treating apparatuses 300 may be adjacently arranged in plural rows. Also, as show in FIG. 16, the guide rail 14' may be shared between these adjacent surface treating apparatuses.

Figure 22:
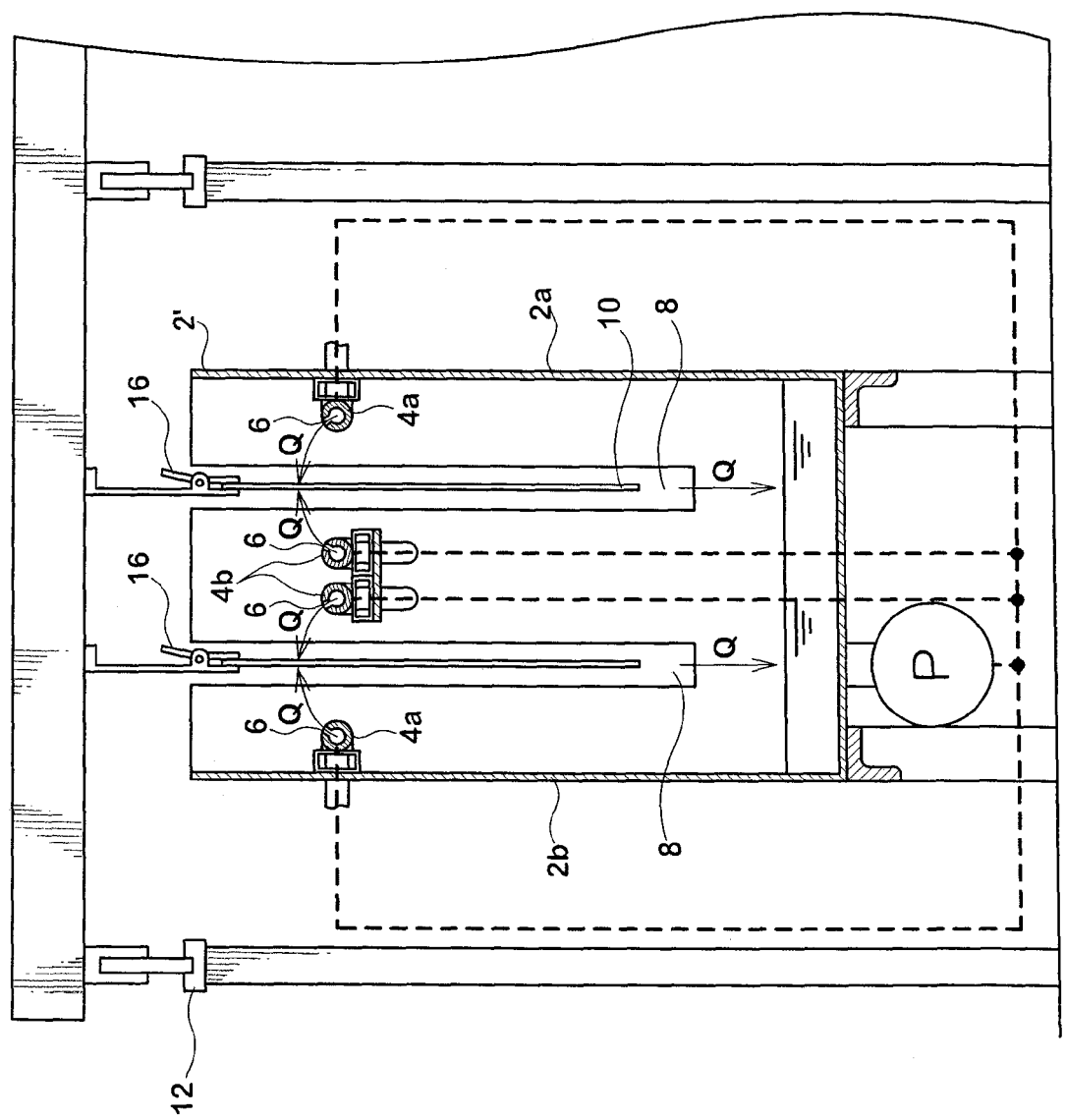
FIG. 22 shows a surface treating apparatus according to another embodiment.

Further, as shown in FIG. 22, the surface treating apparatus may be configured without arranging the guide rail 14' shown in FIG. 16 in one tank body 2' by arranging a plural of the transport hangers 16 and cutouts 8 adjacently. In this case, both sides of the liquid squirting part 4a inside of the tank body 2' are fixed to the side walls 2a, and the middle of liquid squirting part 4b inside of the tank body 2 are fixed to the side walls 2b.

In the above embodiments, plural tanks of the surface treating apparatus 300 are arranged on a straight line. However, plural tanks may be arranged in U-shaped, square-shaped, or L-shaped with installing a movement mechanism such as a Traverser.

In the above embodiments, the convex part 26 (FIG. 9B) is formed merely on the guide rail 14. However, the convex part 26 may be formed on both of the guide rails 12, 14

In the above embodiments, it makes an impact by means of the convex part 26 (FIG. 9B) arranged on the guide rail 14. However, it may make an impact by means of the other structure (for example, by forming a concave portion, and so on).

In the above embodiments, one convex part 26 is arranged on the guide rail 14 (FIG. 9B). However, a plural of convex parts 26' may be arranged on the guide rail 14. Also, the convex part 26 (FIG. 9B) is arranged between the 3rd water-washing tank 312 and the electroless copper plating tank 200 (FIG. 1). However, the convex part 26 may be arranged at the other position.

In the above embodiments, the transport roller 24 is controlled so as to move back and forth on the convex part 26 (FIG. 9B). However, it may be controlled so as to merely pass over the convex part 26 without moving back and forth. For example, the transport roller 24 (FIG. 9B) may be controlled so as to move on the plural convex parts 26 that are arranged on the guide rail 14.

In the above embodiments, the transport roller 24 is controlled so as to move back and forth on the convex part 26 3 times. However, it may be controlled so as to move back and forth until a predetermined condition is satisfied (for example, when it is detected that the smear, or bubbles has been removed from the plate-like work 10 by taking a image with camera and performing an image recognition, and so on.).

In the above embodiments, by operating the circulation pump 50 continuously, the plate-like work 10 is transported inside of the tank body 100 and carried outside of the tank body 100 with squirting the processing solution Q consistently from the squirt port 6 of the liquid squirting part 4. However, it may be controlled so as to squirt the processing solution Q from the squirt port 6 of the liquid squirting part 4 by powering on the circulation pump 50 while the plate-like work 10 is under suspension, or so as not to squirt the processing solution Q from the squirt port 6 of the liquid squirting part 4 by powering off the circulation pump 50 while the plate-like work 10 is in motion.

In the above embodiments, PVC is used as a material for the tank body 2. However, the other may be used (for example, a PP, a FRP, a PPS resin, a PTFE, and a stainless-steel, etc.).

In the above embodiments, electroless copper plating is performed on the plate-like work 10 in the surface treating apparatus 300. However, the other electroless plating may be performed on the plate-like work 10 (for example, electroless nickel plating, electroless tin plating, electroless gold plating, etc.).

Figure 17:
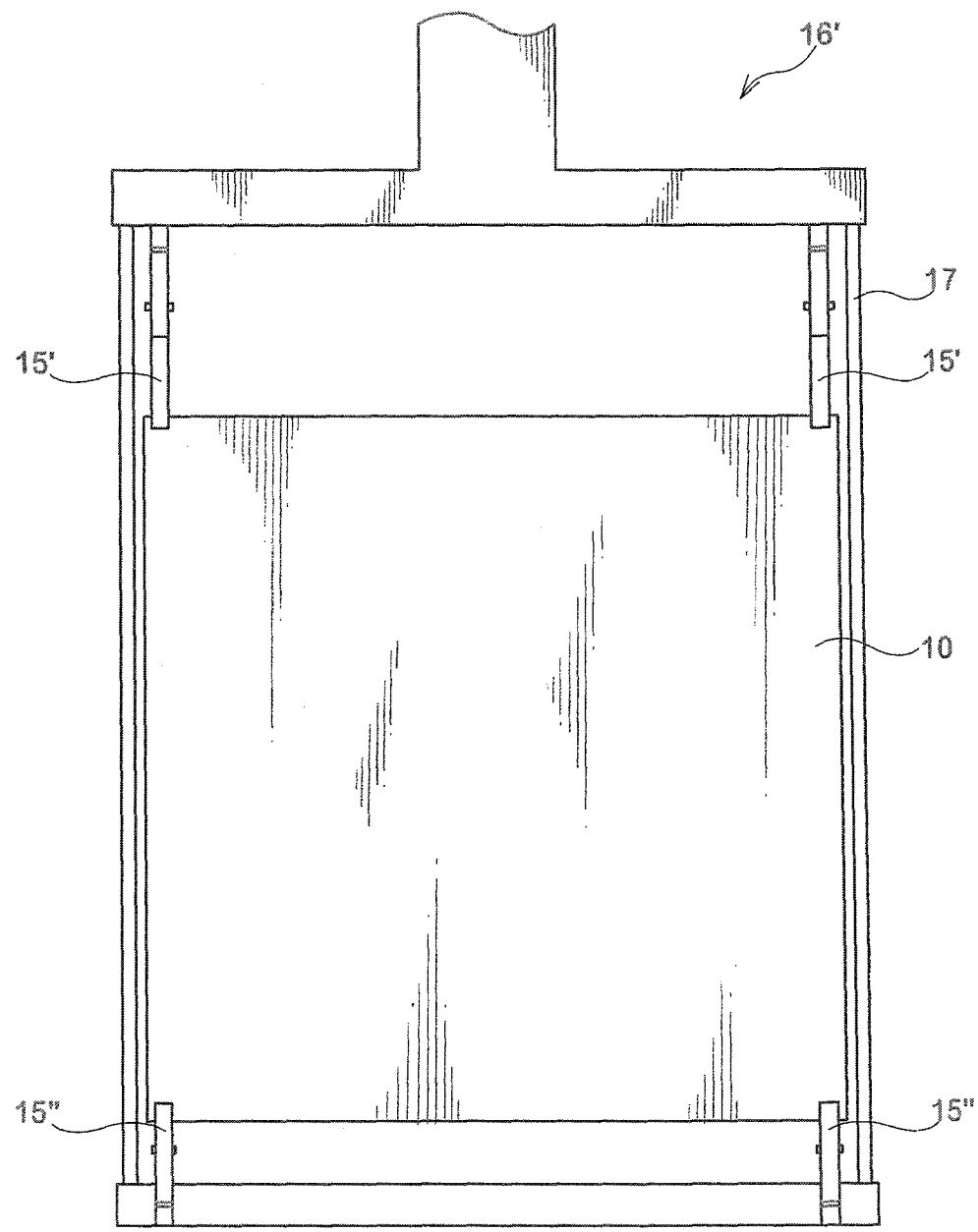
FIG. 17 shows a structure of the transport hanger 16 according to another embodiment.
Figure 18:
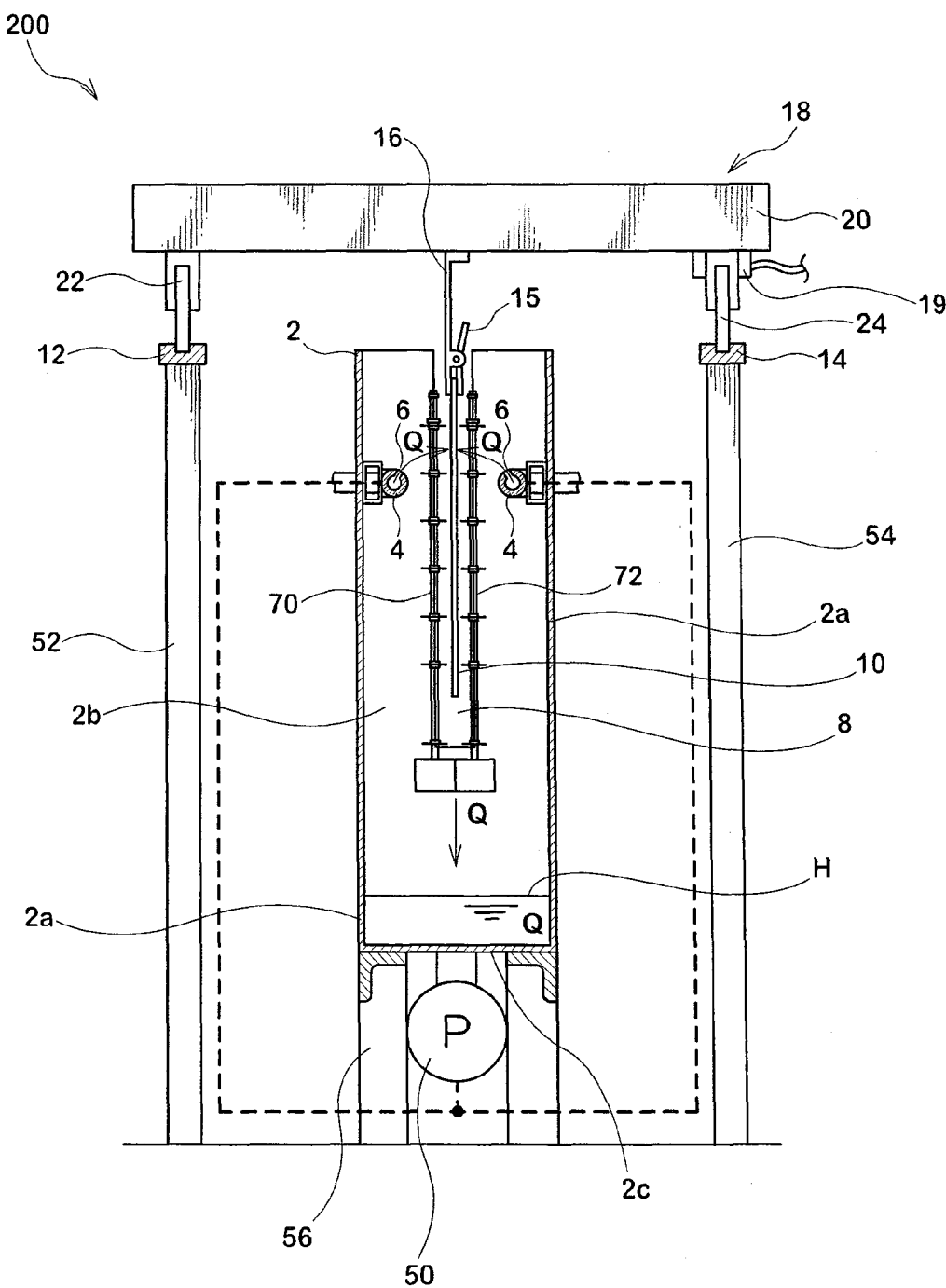
FIG. 18 shows a transport assist device according to another embodiment.
Figure 19:
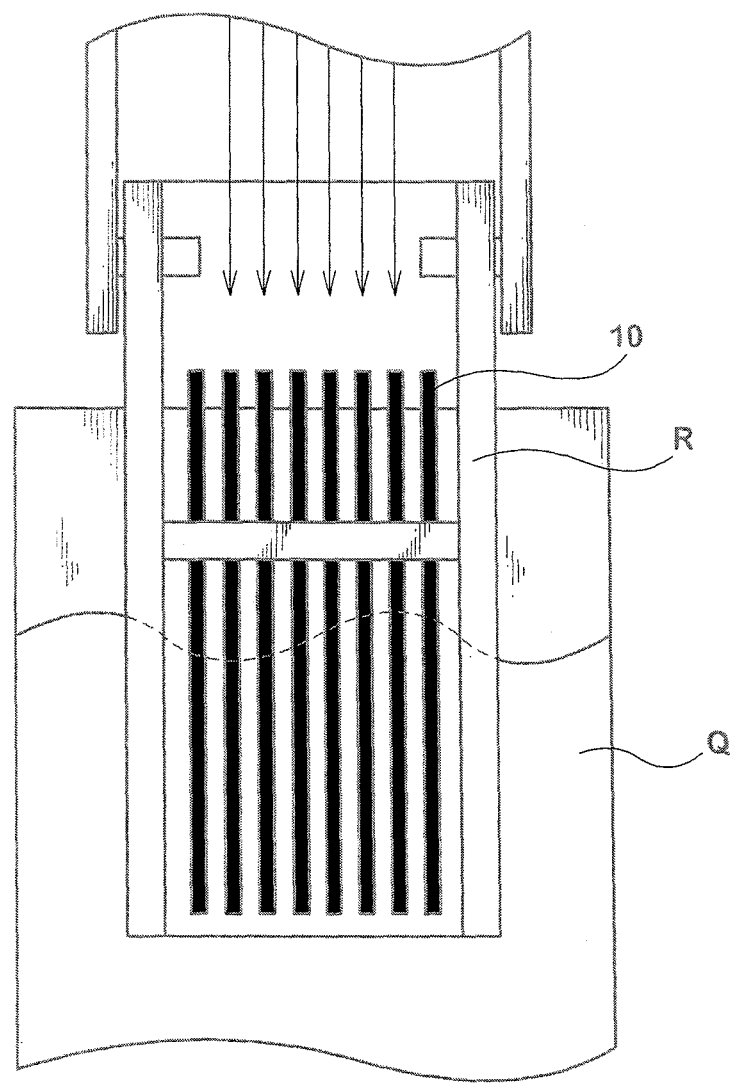
FIG. 19 shows an electroless plating processing method of a related art.
Figure 20:
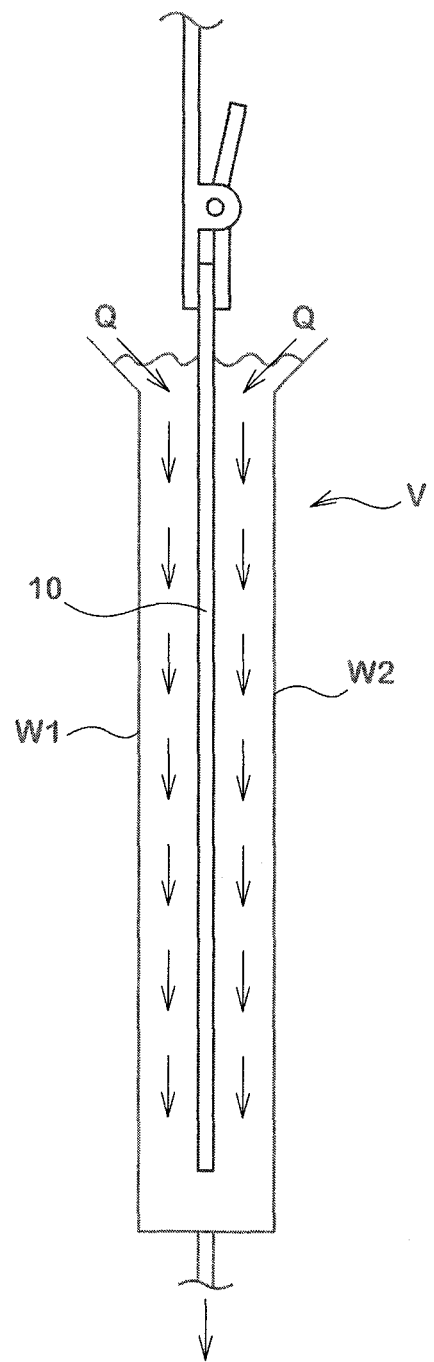
FIG. 20 shows a treatment tank V of a related art.

In the above embodiments, the transport hanger 16 merely clamps the upper end of the plate-like work 10 (FIG. 2). However, lower part of the plate-like work 10 may be weighted, or both upper end 15' and lower end 15" of the plate-like work 10 may be clamped by means of the transport hanger 16' attached to a flame body 17, as shown in FIG. 17. Also, as shown in FIG. 18, it may be transported with preventing from swinging of the plate-like work 10 when transporting by attaching rotary roller stands 70, 72 subsidiary near the slit 8 inside of the tank body 2 that restricts the movement of the plate-like work 10.

In the above embodiments, the transport hanger 16 is transported by means of transport rollers 22, 24 of the transport mechanism 18 powered by a motor. However, the transport hanger 16 may be transported by means of the other driving method such as a pusher, a chain, and a linear motor system, etc.

In the above embodiments, the processing solution Q is applied to both sides of the plate-like work 10 (FIG. 6B). However, the processing solution Q may be applied to one side of the plate-like work 10.

In the above embodiments, a predetermined location on the guide rails 12, 14 is detected by means of the magnetic sensor. However, the predetermined location may be detected by means of the other sensor (such as a bar-code reader, etc.).

In the above embodiments, the treatment object is formed as a rectangular plate-like work 10. However, the treatment object may be formed in other shape (such as a globe, a stick, and a cube, etc.).

What is claimed is:

1. A surface treating apparatus, comprising:
    a transport hanger that clamps and transports a thin plate treatment object, the transport hanger holding the treatment object vertically;
    a tank body, through which the transport hanger moves, that attaches processing solution interiorly to the treatment object;
    a liquid squirting part in the tank body that squirts the processing solution from squirt ports, located on both sides of the vertically held treatment objects, toward the treatment object, the squirt ports located in the squirting port at a squirt angle ranging from 5 degrees to 85 degrees, the squirt angle being an oblique angle only facing upward from a horizontal plane; and
    a transport mechanism that moves the transport hanger into the tank body.

2. The surface treating apparatus according to claim 1, wherein a squirt angle of the processing solution is determined so that the processing solution squirted from the squirt port obliquely upward moves in a parabolic path, and the processing solution is attached to the treatment object at the vicinity of the vertex of the parabola.

3. The surface treating apparatus according to claim 1, wherein the liquid squirting part comprises a pipe member having an inner space, and the squirt port comprises a plurality of holes disposed at predetermined intervals along a longitudinal direction of the pipe member.

4. The surface treating apparatus according to claim 1, wherein the liquid squirting part comprises a pipe member having an inner space, and the squirt port comprises a long hole extending in a longitudinal direction of the pipe member.

5. The surface treating apparatus according to claim 1, wherein a redirection member is attached to an outer periphery of the liquid squirting part so as to overlap the squirt port, and the processing solution squirted from the squirt port is attached to the treatment object after hitting at the redirection member.

6. The surface treating apparatus according to claim 1, wherein the squirt angle of the processing solution squirted from the squirt port can be set to any angle within the range.

7. The surface treating apparatus according to claim 1, wherein plural stages of the liquid squirting part are arranged inside of the tank body.

8. The surface treating apparatus according to claim 1, further comprising an antiscattering member located vertically downward of the transport hanger.

9. The surface treating apparatus according to claim 1, further comprising a liquid storage tank connected to the bottom of the tank body, wherein the bottom of the liquid storage tank is lower than the bottom of the tank body.

10. The surface treating apparatus according to claim 1, further comprising cutouts extending in a vertical direction on the tank body so that the treatment object pass through when the transport hanger is moved.

11. A treatment apparatus including:
    a tank body for attaching processing solution interiorly to a thin plate treatment object which is held vertically and transported, the tank body including a liquid squirting part that squirts the processing solution from squirt port at a squirt angle ranging from 5 degrees to 85 degrees, the squirt angle set to only be obliquely upward from a horizontal plane toward the treatment object, said processing solution being squirted from both sides of the treatment object onto the thin plate of the treatment object which is held vertically, wherein the liquid squirting part is fixed at a predetermined position on an inner wall of the tank body and wherein said processing solution is squirted from both sides of the treatment object.

12. A squirt apparatus for attaching processing solution to a thin plate treatment object which is held vertically including:
    a transport hanger holding the treatment object vertically;
    a tank body; and
    a squirt port located within the tank body that squirts the processing solution, wherein the process solution is squirted from the squirt port at a squirt angle ranging from 5 degrees to 85 degrees which is only obliquely upward from a horizontal plane toward the treatment object, said processing solution is squirted from both sides of the treatment object to the thin plate treatment object which is held vertically.

* * * * *